(12) United States Patent
Fang et al.

(10) Patent No.: US 11,025,170 B2
(45) Date of Patent: *Jun. 1, 2021

(54) SYSTEMS AND METHODS FOR REDUCING SWITCHING LOSS IN POWER CONVERSION SYSTEMS

(71) Applicant: ON-BRIGHT ELECTRONICS (SHANGHAI) CO., LTD., Shanghai (CN)

(72) Inventors: Qian Fang, Shanghai (CN); Huawei Lv, Shanghai (CN); Zhiliang Chen, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/384,346

(22) Filed: Apr. 15, 2019

(65) Prior Publication Data

US 2020/0112255 A1    Apr. 9, 2020

Related U.S. Application Data

(63) Continuation of application No. 15/264,397, filed on Sep. 13, 2016, now Pat. No. 10,320,300.

(30) Foreign Application Priority Data

Jul. 29, 2016    (CN) .......................... 201610613617.X

(51) Int. Cl.
*H02M 3/335* (2006.01)
*H02M 1/08* (2006.01)
(Continued)

(52) U.S. Cl.
CPC ......... *H02M 3/33515* (2013.01); *H02M 1/08* (2013.01); *H02M 3/33507* (2013.01);
(Continued)

(58) Field of Classification Search
CPC ........ H02M 1/08; H02M 1/083; H02M 1/092; H02M 2001/0003; H02M 2001/0009;
(Continued)

(56) References Cited

U.S. PATENT DOCUMENTS

| 5,267,133 A | 11/1993 | Motomura et al. |
| 5,570,278 A | 10/1996 | Cross |

(Continued)

FOREIGN PATENT DOCUMENTS

| CN | 101728958 A | 6/2010 |
| CN | 102023664 A | 4/2011 |

(Continued)

OTHER PUBLICATIONS

Chinese Patent Office, Office Action dated Aug. 1, 2014, in Application No. 201310014860.6.

(Continued)

*Primary Examiner* — Thienvu V Tran
*Assistant Examiner* — Carlos O Rivera-Perez
(74) *Attorney, Agent, or Firm* — Faegre Drinker Biddle & Reath LLP

(57) ABSTRACT

Power converter and method thereof according to certain embodiments. For example, the power converter includes a primary winding, and a secondary winding coupled to the primary winding. Additionally, the power converter includes a first switch including a first switch terminal, a second switch terminal, and a third switch terminal. The first switch is configured to affect a first current associated with the primary winding. The first switch terminal corresponds to a first voltage, and the second switch terminal corresponds to a second voltage. The first voltage minus the second voltage is equal to a voltage difference. Moreover, the power converter includes a second switch including a fourth switch terminal, a fifth switch terminal, and a sixth switch terminal (Continued)

and configured to affect a second current associated with the secondary winding.

26 Claims, 11 Drawing Sheets

(51) Int. Cl.
    *H03F 3/45*     (2006.01)
    *H02M 1/00*     (2006.01)

(52) U.S. Cl.
    CPC . *H03F 3/45071* (2013.01); *H02M 2001/0009* (2013.01); *H02M 2001/0054* (2013.01); *H03F 2203/45288* (2013.01); *Y02B 70/10* (2013.01)

(58) Field of Classification Search
    CPC . H02M 2001/0012; H02M 2001/0016; H02M 2001/0025; H02M 2001/0038; H02M 2001/0048; H02M 2001/0051; H02M 2001/0054; H02M 2001/0058; H02M 2007/4815; H02M 3/22; H02M 3/24; H02M 3/28; H02M 3/315; H02M 3/3155; H02M 3/335; H02M 3/33507; H02M 3/33515; H02M 3/33523; H02M 3/3353; H02M 3/33538; H02M 3/33592; H02M 3/33546; H02M 3/33553; H02M 3/33569; H02M 3/33576; H02M 3/33584; Y02B 70/14; Y02B 70/1433; Y02B 70/1441; Y02B 70/1458; Y02B 70/1475; Y02B 70/1491; Y02B 70/10; H03F 3/45071; H03F 2203/45288
    USPC .... 363/15–21.18, 37, 40–43, 74, 89, 95, 97, 363/98, 123, 124, 131–134; 323/222–226, 235, 237, 238, 266, 323/271–275, 277, 280–287, 351
    See application file for complete search history.

(56) References Cited

U.S. PATENT DOCUMENTS

| | | | |
|---|---|---|---|
| 5,768,118 | A | 6/1998 | Faulk et al. |
| 6,069,804 | A | 5/2000 | Ingman et al. |
| 6,229,717 | B1 | 5/2001 | Corral Blanco et al. |
| 6,366,480 | B2 | 4/2002 | Hosotani et al. |
| 6,594,161 | B2 | 7/2003 | Jansen et al. |
| 8,427,850 | B2 | 4/2013 | Morota et al. |
| 8,693,223 | B2 | 4/2014 | Lin |
| 9,048,738 | B2 | 6/2015 | Lv et al. |
| 9,641,082 | B2 | 5/2017 | Lv et al. |
| 10,320,300 | B2 | 6/2019 | Fang et al. |
| 2001/0007530 | A1 | 7/2001 | Hosotani |
| 2003/0151927 | A1 | 8/2003 | Wittenbreder, Jr. |
| 2004/0027400 | A1 | 2/2004 | Ryu et al. |
| 2006/0187688 | A1 | 8/2006 | Tsuruya |
| 2009/0086517 | A1 | 4/2009 | Wei et al. |
| 2010/0110732 | A1 | 5/2010 | Moyer et al. |
| 2010/0128501 | A1 | 6/2010 | Huang et al. |
| 2014/0198539 | A1 | 7/2014 | Lv et al. |
| 2015/0003120 | A1 | 1/2015 | Lv et al. |
| 2018/0041132 | A1 | 2/2018 | Fang et al. |
| 2019/0006948 | A9 | 1/2019 | Fang et al. |

FOREIGN PATENT DOCUMENTS

| | | |
|---|---|---|
| CN | 102447413 A | 5/2012 |
| CN | 102723856 A | 10/2012 |
| CN | 103378751 A | 10/2013 |
| CN | 103490605 A | 1/2014 |
| CN | 103887980 A | 6/2014 |
| JP | 2005-73391 A | 3/2005 |
| TW | I-243530 | 11/2005 |
| TW | I-320257 | 2/2010 |
| TW | 201135391 | 10/2011 |
| TW | I-382643 | 1/2013 |
| TW | 201424230 | 6/2014 |

OTHER PUBLICATIONS

Chinese Patent Office, Office Action dated Aug. 13, 2018, in Application No. 201610613617.X.

Taiwan Patent Office, Office Action dated Sep. 26, 2014, in Application No. 102117551.

Taiwan Patent Office, Office Action dated Apr. 21, 2017, in Application No. 105133596.

SYSTEMS AND METHODS FOR REDUCING SWITCHING LOSS IN POWER CONVERSION SYSTEMS

1. CROSS-REFERENCES TO RELATED APPLICATIONS

This application is a continuation of U.S. patent application Ser. No. 15/264,397, filed Sep. 13, 2016, which claims priority to Chinese Patent Application No. 201610613617.X, filed Jul. 29, 2016, both of the above-referenced applications being incorporated by reference herein for all purposes.

2. BACKGROUND OF THE INVENTION

Certain embodiments of the present invention are directed to integrated circuits. More particularly, some embodiments of the invention provide systems and methods for reducing switching loss. Merely by way of example, some embodiments of the invention have been applied to power conversion systems. But it would be recognized that the invention has a much broader range of applicability.

FIG. 1 is a simplified diagram showing a conventional power conversion system with a rectifying circuit. The power conversion system 100 (e.g., a power converter) includes a rectifying bridge 101, a primary controller 102 (e.g., a chip), a primary winding 104, a secondary winding 106, a secondary controller 108 (e.g., a chip), a diode 109, an auxiliary winding 124, a current sensing resistor 128, capacitors 103, 107, 112, 140 and 142, resistors 105, 122, 126, 132, 146, 148, 150 and 152, a shunt regulator (e.g., TL431) 144, an opto-coupler 171, a capacitor 160, and switches 110 and 130. The primary controller 102 includes a comparator 162, a demagnetization detector 164, and a flip-flop 166. The secondary controller 108 includes comparators 168 and 176, a timer 174 (e.g., a 2-μs leading-edge-blanking timer), and a flip-flop 172.

As shown in FIG. 1, the ground voltage of the primary side is the ground voltage of the chip 102, and the ground voltage of the secondary side is the ground voltage of the chip 108. The ground voltage of the chip 102 is biased to 0 volts, and the ground voltage of the chip 102 is separated from the ground voltage of the chip 108 by at least the opto-coupler 171.

If the switch 130 (e.g., a transistor) is closed (e.g., turned on), the energy is stored in the transformer that includes the primary winding 104 and the secondary winding 106. The transformer generates an output voltage 180, which is received by a voltage divider that includes the resistors 150 and 148. Through the opto-coupler 171, a feedback signal 178 is generated. If the switch 130 is open (e.g., turned off), the stored energy of the transformer is transferred to the secondary side, and a demagnetization process begins. During the demagnetization process, the switch 110 (e.g., a transistor) is closed (e.g., turned on). When the demagnetization process ends, the switch 110 is opened (e.g., turned off), and the series resonance occurs between the primary winding 104 and a parasitic capacitor 199 of the switch 130 (e.g., a transistor).

As shown in FIG. 1, the voltage drop across the parasitic capacitor 199 of the switch 130 is equal to the voltage drop between the drain terminal and the source terminal of the transistor 130. If the voltage drop between the drain terminal and the source terminal of the transistor 130 (e.g., $V_{ds}$) decreases to a low magnitude (e.g., a local minimum), the switch 130 is closed (e.g., turned on) in order to reduce switching loss and improve system efficiency.

FIG. 2 is a simplified timing diagram for the conventional power conversion system 100. The waveform 202 represents a drive signal 182 as a function of time, the waveform 204 represents a current sensing signal 184 (e.g., $V_{CS}$) as a function of time, the waveform 206 represents a signal 186 (e.g., INV) as a function of time, and the waveform 208 represents a detection signal 188 (e.g., DEM_on) as a function of time. In addition, the waveform 210 represents a current 190 (e.g., $I_s$) that flows through the secondary winding 106 as a function of time, the waveform 212 represents a voltage (e.g., $V_{sns}$) as a function of time, and the waveform 214 represents a drive signal 194 (e.g., an SR_gate signal) as a function of time.

As shown by the waveform 202, during an on-time period $T_1$, the drive signal 182 is at a logic high level and the switch 130 is closed (e.g., turned on). When the switch 130 is closed (e.g., turned on), a current 196 flows through the primary winding 104, the switch 130, and the resistor 128, and generates the current sensing signal 184 (e.g., $V_{CS}$). As shown by the waveform 204, the current sensing signal 184 (e.g., $V_{CS}$) increases from a value 216 to a value 218 during the on-time period $T_1$. As shown by the waveform 214, on the secondary side of the power conversion system 100, the drive signal 194 is at a logic low level and the switch 110 is open (e.g., turned off) during the on-time period $T_1$. As shown by the waveform 212, the voltage signal 192 (e.g., $V_{sns}$) remains at a value 224 during the on-time period $T_1$.

As shown by the waveform 202, at the beginning time $t_0$ of an off-time period $T_2$, the drive signal 182 changes from the logic high level to the logic low level, and the switch 130 is opened (e.g., turned off) during the off-time period $T_2$. As shown by the waveform 204, at the beginning time $t_0$ of an off-time period $T_2$, the current sensing signal 184 (e.g., $V_{CS}$) decreases rapidly from the value 218 to the value 216. As shown by the waveform 206, at the beginning time $t_0$ of the off-time period $T_2$, the voltage signal 186 (e.g., INV) associated with the auxiliary winding 124 increases rapidly from a value 228 to a value 230. As shown by the waveform 212, at the beginning time $t_0$ of the off-time period $T_2$, the voltage signal 192 (e.g., $V_{sns}$) decreases rapidly from the value 224 to a value 226. For example, the value 224 is higher than zero volts, and the value 226 is lower than zero volts.

As shown by the waveform 210, the current 190 (e.g., $I_s$) increases rapidly from a value 222 at the time $t_0$ to a value 220 at a time $t_1$. As shown by the waveform 214, at the time $t_1$ of the off-time period $T_2$, the drive signal 194 changes from the logic low level to the logic high level, and the switch 110 is closed (e.g., turned on). As shown by the waveform 212, at the time $t_1$ of the off-time period $T_2$, the voltage signal 192 (e.g., $V_{sns}$) increases from the value 226 to a value 232. For example, the value 232 is lower than zero volts. As shown by the waveform 206, from the time $t_0$ to a time $t_2$ of the off-time period $T_2$, the voltage signal 186 (e.g., INV) associated with the auxiliary winding 124 remains approximately at the value 230.

As shown by the waveform 214, from the time $t_1$ to the time $t_2$ of the off-time period $T_2$ (e.g., during a time period $T_4$), the drive signal 194 remains at the logic high level, and the switch 110 remains closed (e.g., turned on). As shown by the waveform 212, from the time $t_1$ to the time $t_2$ of the off-time period $T_2$ (e.g., during the time period $T_4$), the voltage signal 192 (e.g., $V_{sns}$) increases gradually from the value 232 to a value 234. For example, the value 234 is equal to −12 mV. As shown by the waveform 210, from the time $t_1$ to the time $t_2$ of the off-time period $T_2$ (e.g., during the time period T$_4$), the current 190 (e.g., I$_s$) decreases from the value 220 to the value 222. For example, the value 222 is close to (e.g., equal to) zero amps. In another example, at the time t$_2$, the demagnetization process ends.

Referring to FIG. 1, at the time t$_2$ of the off-time period T$_2$ (e.g., at the end of the demagnetization process), the comparator 168 outputs a comparison signal 191 to the flip-flop 172 (e.g., the "R" terminal of the flip-flop 172). As shown by the waveform 214, at the time t$_2$ of the off-time period T$_2$, the drive signal 194 changes from the logic high level to the logic low level, and the switch 110 becomes open (e.g., turned off). For example, the time t$_2$ is the beginning time of a time period T$_5$.

As shown by the waveform 206, from the beginning time t$_2$ of the time period T$_5$ to the time t$_3$, series resonance occurs between the primary winding 104 and the parasitic capacitor 199 of the switch 130, and the voltage signal 186 (e.g., INV) associated with the auxiliary winding 124 decreases until the voltage signal 186 reaches a minimum value 239 (e.g., at t$_3$).

As shown by the waveform 208, at the time t$_3$, the demagnetization detector 164 generates a pulse in the signal 188 (e.g., DEM_on). In response to the pulse, as shown by the waveform 202, at the time t$_3$, the drive signal 182 changes from the logic low level to the logic high level, and the switch 130 is closed (e.g., turned on). For example, the time t$_3$ is the beginning of another on-time period T$_3$ for the drive signal 182.

As shown in FIGS. 1 and 2, the turn-on voltage of the switch 130 is determined as follows:

$$V_{turn\_on} = V_{in} - N \times V_o \qquad \text{(Equation 1)}$$

where $V_{turn\_on}$ represents the turn-on voltage of the switch 130, $V_{in}$ represents an input voltage 198, N represents a turns ratio between the primary winding 104 and the secondary winding 106, and $V_o$ represents the output voltage 180.

According to Equation 1, the turn-on voltage of the switch 130 increases with the input voltage 198, so the turn-on voltage of the switch 130 is higher at high input voltage than at low input voltage. Also, the switching frequency of the conventional power conversion system 100 (e.g., a quasi-resonant power converter) is higher at high input voltage than at low input voltage. Therefore, at high input voltage, switching loss of the conventional power conversion system 100 often is significantly larger than that at low input voltage. Such switching loss at high input voltage can severely adversely affect the system efficiency.

To reduce the switching loss, a delay can be introduced between the end of the demagnetization process and the turning-off of the switch 110. FIG. 3 is a simplified conventional timing diagram for another power conversion system. The waveform 302 represents a drive signal on the primary side as a function of time, the waveform 304 represents a current sensing signal (e.g., V$_{CS}$) as a function of time, the waveform 305 represents a current that flows through the primary winding (e.g., I$_{in}$) as a function of time, the waveform 306 represents another drive signal (e.g., an SR_gate signal) on the secondary side as a function of time, the waveform 308 represents a current that flows through a secondary winding as a function of time, and the waveform 310 represents a voltage drop on a switch on the primary side as a function of time. For example, the switch on the primary side is a transistor, and the voltage drop on the switch is the voltage drop between the drain terminal and the source terminal of the transistor (e.g., V$_{ds}$).

As shown in FIG. 3, the time t$_{11}$ represents the end time of the demagnetization process, and the time t$_{12}$ represents the time when the another drive signal (e.g., the SR_gate signal) changes from the logic high level to the logic low level and the switch on the secondary side becomes opened (e.g., turned off). From the time t$_{11}$ to the time t$_{12}$, there is a delay as indicated by the time period T$_d$.

However, the conventional power conversion systems have various disadvantages. Hence it is highly desirable to improve the techniques of reducing switching loss of power conversion systems.

3. BRIEF SUMMARY OF THE INVENTION

Certain embodiments of the present invention are directed to integrated circuits. More particularly, some embodiments of the invention provide systems and methods for reducing switching loss. Merely by way of example, some embodiments of the invention have been applied to power conversion systems. But it would be recognized that the invention has a much broader range of applicability.

According to one embodiment, a power converter includes a primary winding, and a secondary winding coupled to the primary winding. Additionally, the power converter includes a first switch including a first switch terminal, a second switch terminal, and a third switch terminal. The first switch is configured to affect a first current associated with the primary winding. The first switch terminal corresponds to a first voltage, and the second switch terminal corresponds to a second voltage. The first voltage minus the second voltage is equal to a voltage difference. Moreover, the power converter includes a second switch including a fourth switch terminal, a fifth switch terminal, and a sixth switch terminal and configured to affect a second current associated with the secondary winding. Also, the power converter includes a sampled-voltage generator configured to sample a third voltage before the first switch becomes closed and generate a sampled voltage based at least in part on the third voltage. The third voltage is related to the voltage difference before the first switch becomes closed. Additionally, the power converter includes an error amplifier configured to receive the sampled voltage and a reference voltage and generate an amplified voltage based at least in part on the sampled voltage and the reference voltage. Moreover, the power converter includes a threshold voltage generator configured to generate a threshold voltage based on at least information associated with the amplified voltage. Also, the power converter includes a drive signal generator configured to receive the threshold voltage and a fourth voltage, generate a drive signal based at least in part on the threshold voltage and the fourth voltage, and output the drive signal to the second switch, the fourth voltage representing the second current. The drive signal generator is further configured to, in response to the fourth voltage becoming larger than the threshold voltage, generate the drive signal to open the second switch. The power converter is configured to, in response to the sampled voltage and the reference voltage not being equal, change the threshold voltage with time.

According to another embodiment, a controller for a power converter includes a sampled-voltage generator configured to sample a first voltage before a first switch becomes closed and generate a sampled voltage based at least in part on the first voltage. The first voltage is related to a voltage difference before the first switch becomes closed. The first switch includes a first switch terminal, a second switch terminal, and a third switch terminal, and is configured to affect a first current associated with a primary winding of the power converter. The first switch terminal corresponds to a second voltage, and the second switch terminal corresponds to a third voltage. The voltage difference is equal to the second voltage minus the third voltage. Additionally, the controller includes an error amplifier configured to receive the sampled voltage and a reference voltage, generate an amplified voltage based at least in part on the sampled voltage and the reference voltage, and output the amplified voltage in order for a threshold voltage generator to generate a threshold voltage. The threshold voltage generator is configured to generate the threshold voltage based on at least information associated with the amplified voltage, and output the threshold voltage to a drive signal generator. The drive signal generator is configured to receive the threshold voltage and a fourth voltage, generate a drive signal based at least in part on the threshold voltage and the fourth voltage, the fourth voltage representing a second current associated with a secondary winding of the power converter, the secondary winding coupled to the primary winding, and output the drive signal to a second switch. The second switch includes a fourth switch terminal, a fifth switch terminal, and a sixth switch terminal, and is configured to affect the second current. The drive signal generator is further configured to, in response to the fourth voltage becoming larger than the threshold voltage, generate the drive signal to open the second switch. The controller is configured to, in response to the sampled voltage and the reference voltage not being equal, generate the amplified voltage to change the threshold voltage with time.

According to yet another embodiment, a controller for a power converter includes a threshold voltage generator configured to generate a threshold voltage based on at least information associated with an amplified voltage generated by an error amplifier. Additionally, the controller includes a drive signal generator configured to receive the threshold voltage and a first voltage, generate a drive signal based at least in part on the threshold voltage and the first voltage, and output the drive signal to a first switch. The first voltage represents a first current. The first switch includes a first switch terminal, a second switch terminal, and a third switch terminal, and is configured to affect the first current associated with a secondary winding coupled to a primary winding of the power converter. The error amplifier is configured to receive a sampled voltage from a sampled-voltage generator and a reference voltage, and generate the amplified voltage based at least in part on the sampled voltage and the reference voltage. The sampled-voltage generator is configured to sample a second voltage before a second switch becomes closed, and generate the sampled voltage based at least in part on the second voltage. The second voltage is related to a voltage difference before the second switch becomes closed. The second switch includes a fourth switch terminal, a fifth switch terminal, and a sixth switch terminal. The second switch is configured to affect a second current associated with the primary winding. The fourth switch terminal corresponds to a third voltage, and the fifth switch terminal corresponds to a fourth voltage. The third voltage minus the fourth voltage is equal to the voltage difference. The drive signal generator is further configured to, in response to the first voltage becoming larger than the threshold voltage, generate the drive signal to open the first switch. The threshold voltage generator is further configured to, in response to the sampled voltage and the reference voltage not being equal, change the threshold voltage with time.

According to yet another embodiment, a method for a power converter includes sampling a first voltage before a first switch becomes closed. The first switch includes a first switch terminal, a second switch terminal, and a third switch terminal. The first switch is configured to affect a first current associated with a primary winding of the power converter. Additionally, the method includes generating a sampled voltage based at least in part on the first voltage. The first voltage is related to a voltage difference before a first switch becomes closed. The first switch terminal corresponds to a second voltage, and the second switch terminal corresponds to a third voltage. The second voltage minus the third voltage is equal to the voltage difference. Moreover, the method includes receiving the sampled voltage and a reference voltage, and generating an amplified voltage based at least in part on the sampled voltage and the reference voltage. Also, the method includes generating a threshold voltage based on at least information associated with the amplified voltage. Additionally, the method includes receiving the threshold voltage and a fourth voltage, and generating a drive signal based at least in part on the threshold voltage and the fourth voltage. Moreover, the method includes outputting the drive signal to a second switch. The fourth voltage representing a second current. The second switch includes a fourth switch terminal, a fifth switch terminal, and a sixth switch terminal, and is configured to affect the second current associated with a secondary winding coupled to the primary winding. The generating a drive signal based at least in part on the threshold voltage and the fourth voltage includes, in response to the fourth voltage becoming larger than the threshold voltage, generating the drive signal to open the second switch. The generating a threshold voltage based on at least information associated with the amplified voltage includes, in response to the sampled voltage and the reference voltage not being equal, changing the threshold voltage with time.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

Certain embodiments of the present invention are directed to integrated circuits. More particularly, some embodiments of the invention provide systems and methods for reducing switching loss. Merely by way of example, some embodiments of the invention have been applied to power conversion systems. But it would be recognized that the invention has a much broader range of applicability.

Figure 1:
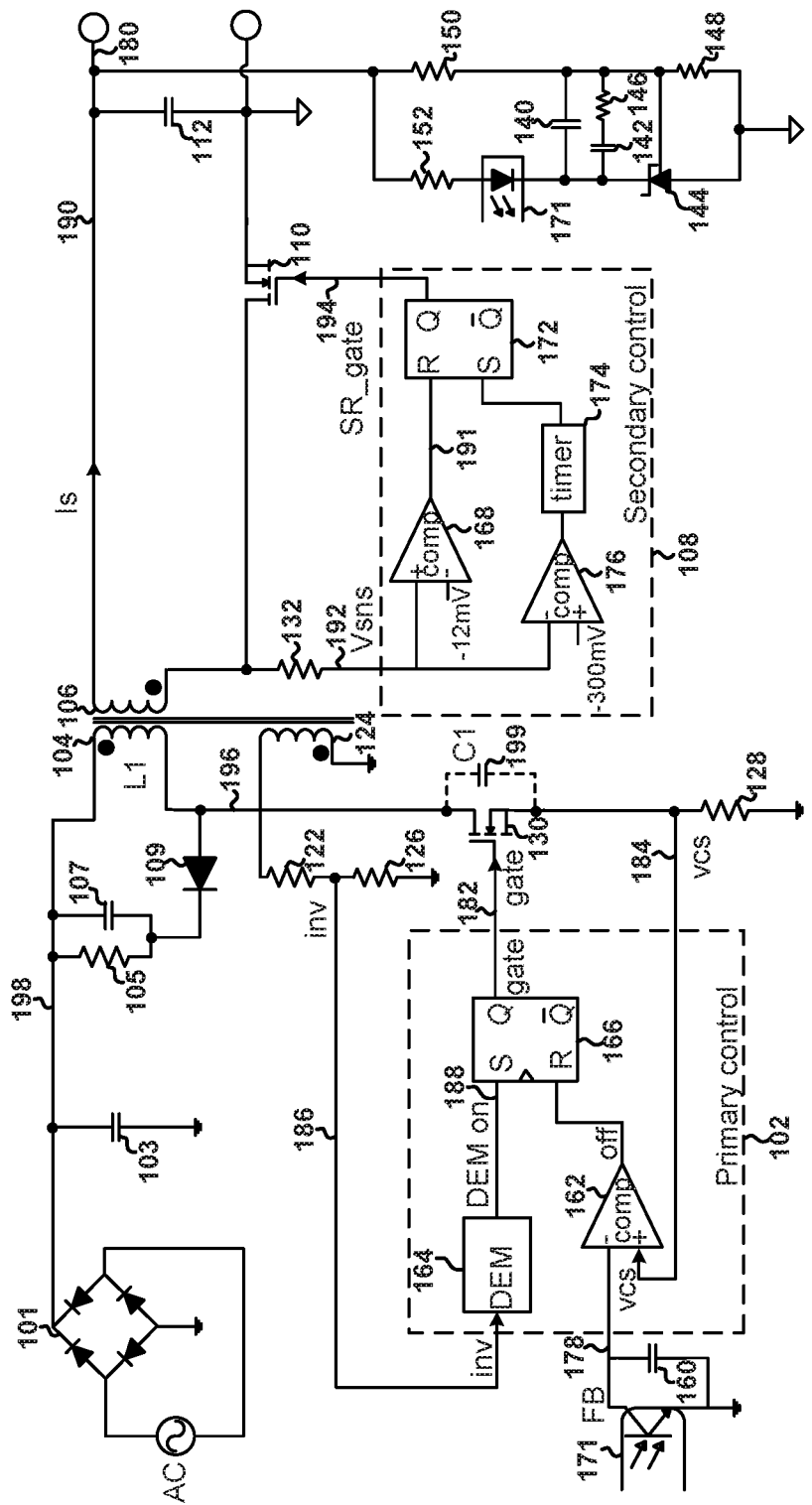
FIG. 1 is a simplified diagram showing a conventional power conversion system with a rectifying circuit.
Figure 2:
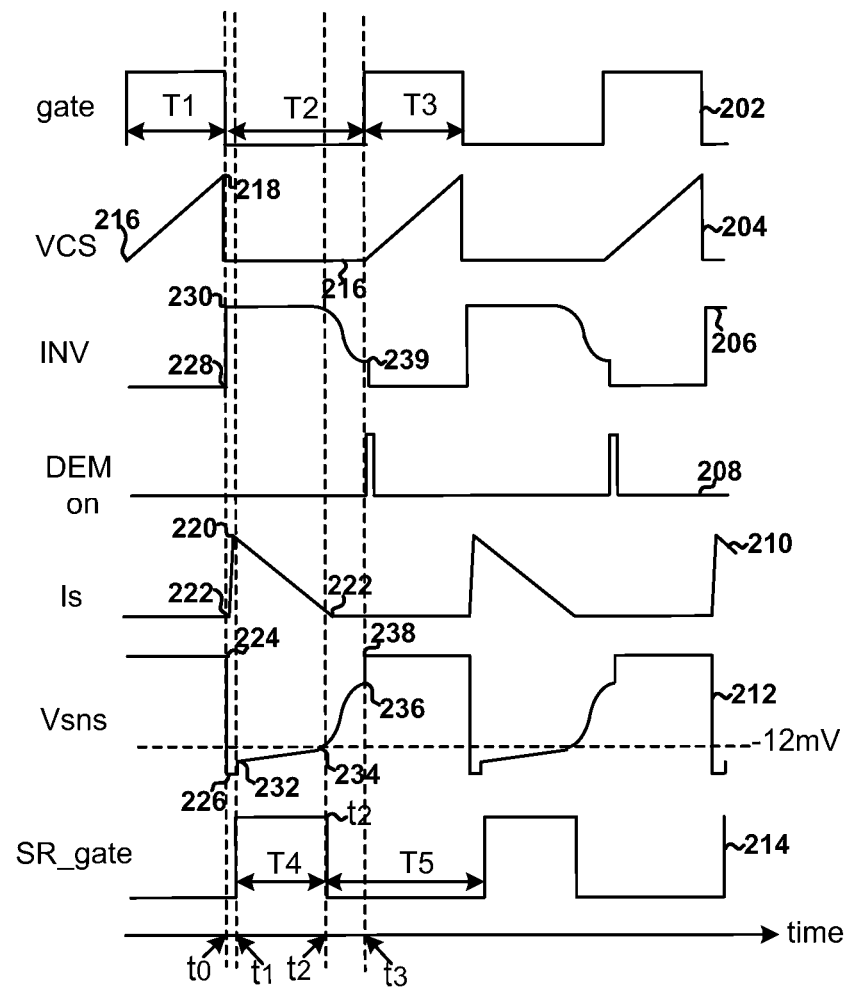
FIG. 2 is a simplified timing diagram for the conventional power conversion system as shown in FIG. 1.
Figure 3:
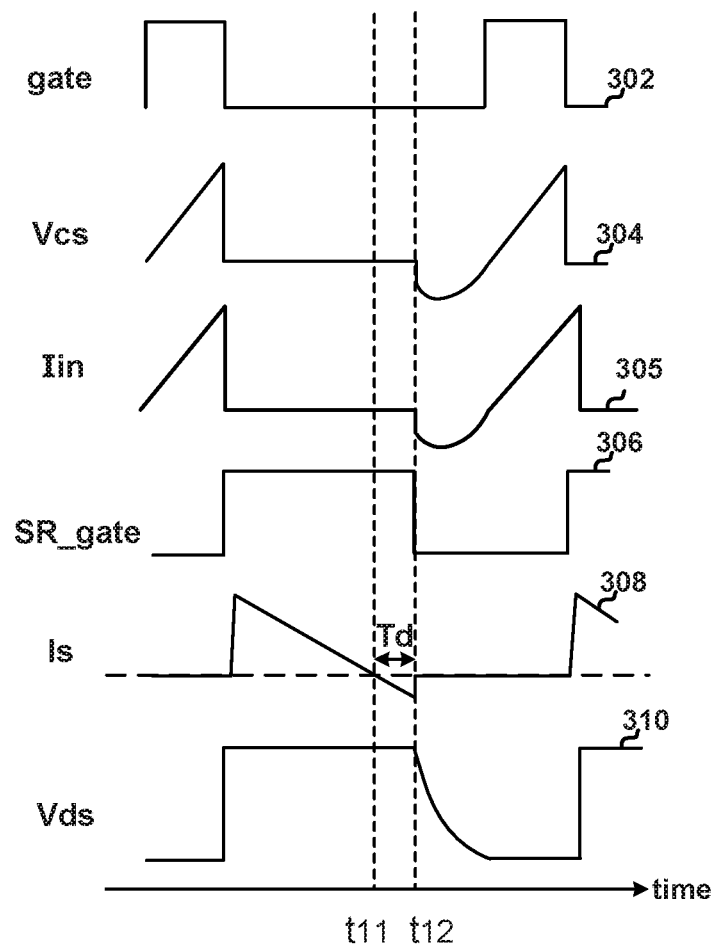
FIG. 3 is a simplified conventional timing diagram for another power conversion system.

Referring to FIG. 3, if the time period $T_d$ is fixed in magnitude, even though the voltage drop on the switch (e.g., $V_{ds}$ of the transistor) on the primary side can drop to a local minimum at which the switch on the primary side becomes closed (e.g., turned on), this local minimum is not always close to or equal to zero volts according to some embodiments.

Figure 4A:
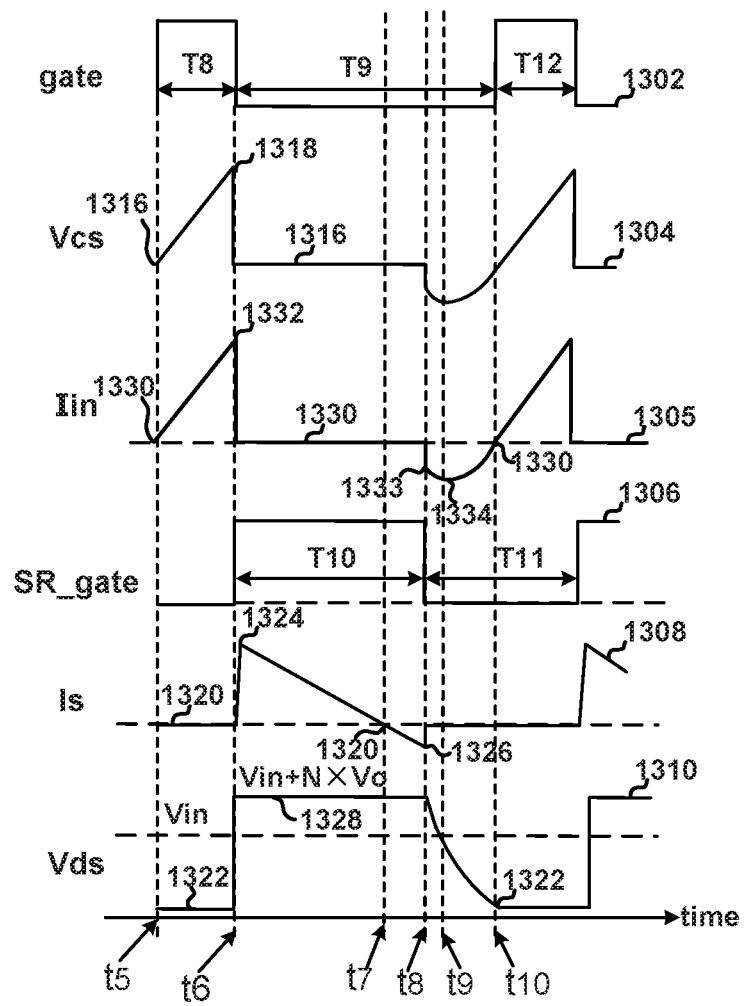
FIG. 4(A) is a simplified timing diagram for a power conversion system.
Figure 4B:
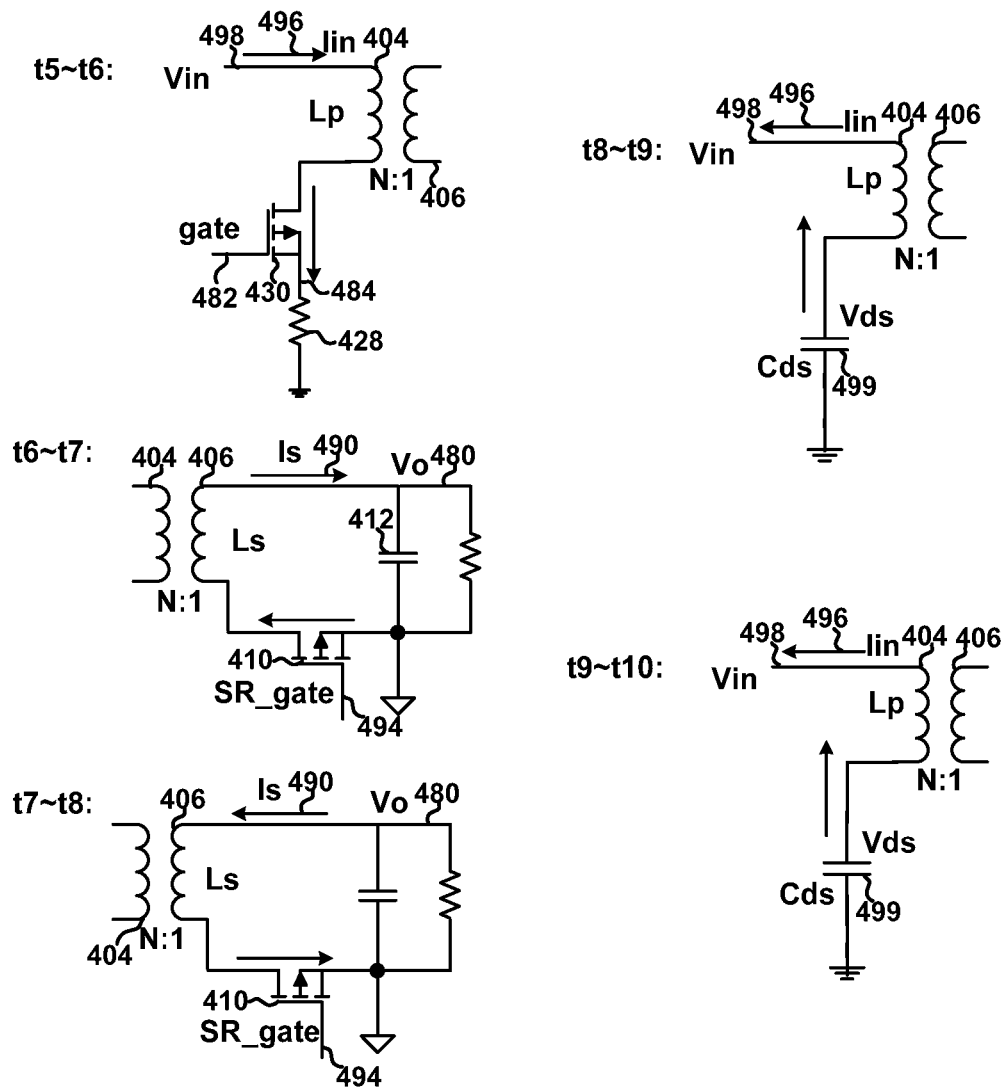
FIG. 4(B) is a simplified diagram showing equivalent circuits for different time periods as shown in FIG. 4(A) according to certain embodiments.

FIG. 4(A) is a simplified timing diagram for a power conversion system, and FIG. 4(B) is a simplified diagram showing equivalent circuits for different time periods as shown in FIG. 4(A) according to certain embodiments. Referring to FIGS. 4(A) and (B), the waveform 1302 represents a drive signal 482 on the primary side as a function of time, the waveform 1304 represents a current sensing signal 484 (e.g., $V_{CS}$) as a function of time, the waveform 1305 represents a current 496 (e.g., $I_{in}$) that flows through a primary winding 404 as a function of time, the waveform 1306 represents another drive signal 494 (e.g., an SR_gate signal) on the secondary side as a function of time, the waveform 1308 represents a current 490 that flows through a secondary winding 406 as a function of time, and the waveform 1310 represents a voltage drop on a switch 430 on the primary side as a function of time. For example, the switch 430 on the primary side is a transistor, and the voltage drop on the switch 430 is the voltage drop between the drain terminal and the source terminal of the transistor (e.g., $V_{ds}$).

As shown by the waveform 1302, during an on-time period $T_8$ (e.g., from the time $t_5$ to the time $t_6$) the drive signal 482 is at a logic high level and the switch 430 is closed (e.g., turned on). When the switch 430 is closed (e.g., turned on), the current 496 flows through the primary winding 404, the switch 430, and a resistor 428, and generates the current sensing signal 484 (e.g., $V_{CS}$). As shown by the waveform 1304, the current sensing signal 484 (e.g., $V_{CS}$) increases from a value 1316 to a value 1318 during the on-time period $T_8$, and as shown by the waveform 1305, the current 496 (e.g., $I_{in}$) that flows through the primary winding 404 increases from a value 1330 to a value 1332 during the on-time period $T_8$. As shown by the waveform 1306, on the secondary side of the power conversion system, the drive signal 494 (e.g., the SR_gate signal) is at a logic low level and a switch 410 (e.g., a transistor) is open (e.g., turned off) during the on-time period $T_8$. As shown by the waveform 1308, during the on-time period $T_8$, the secondary current 490 remains at a value 1320 (e.g., 0 A). As shown by the waveform 1310, during the on-time period $T_8$, the voltage drop $V_{ds}$ on the switch 430 remains at a value 1322 (e.g., 0 V).

As shown by the waveform 1302, at the beginning time $t_6$ of an off-time period $T_9$, the drive signal 482 changes from the logic high level to the logic low level, and the switch 430 is opened (e.g., turned off) during the off-time period $T_9$. As shown by the waveform 1304, at the beginning time $t_6$ of the off-time period $T_9$, the current sensing signal 484 (e.g., $V_{CS}$) decreases rapidly from the value 1318 to the value 1316, and as shown by the waveform 1305, at the beginning time $t_6$ of the off-time period $T_2$, the current 496 (e.g., $I_{in}$) that flows through the primary winding 404 decreases rapidly from the value 1332 to the value 1330. As shown by the waveform 1306, at the beginning time $t_6$ of the off-time period $T_9$, the drive signal 494 changes from the logic low level to the logic high. As shown by the waveform 1308, at the beginning time $t_6$ of the off-time period $T_9$, the switch 410 becomes closed (e.g., turned on), and the current 490 that flows through the secondary winding 406 increases rapidly from the value 1320 to the value 1324. As shown by the waveform 1310, at the beginning time $t_6$ of the off-time period $T_9$, the voltage drop $V_{ds}$ on the switch 430 increases rapidly from the value 1322 to a value 1328. For example, the value 1328 is equal to $V_{in}+N\times V_o$, where $V_{in}$ represents an input voltage 498, N represents a turns ratio between the primary winding 404 and the secondary winding 406, and $V_o$ represents the output voltage 480.

As shown by the waveform 1306, from the time $t_6$ to the time $t_8$ of the off-time period $T_9$ (e.g., during a time period $T_{10}$), the drive signal 494 (e.g., the SR_gate signal) remains at the logic high level, and the switch 410 remains closed (e.g., turned on). As shown by the waveform 1308, from the time $t_6$ to the time $t_7$ of the off-time period $T_9$, the current 490 (e.g., $I_s$) decreases from the value 1324 to the value 1320. For example, the value 1320 is equal to zero amps, and at the time $t_7$, the demagnetization process ends. In another example, from the time $t_7$ to the time $t_8$ of the off-time period $T_9$, the drive signal 494 (e.g., the SR_gate signal) remains at the logic high level and the switch 410 remains closed (e.g., turned on). As shown by the waveform 1308, from the time $t_7$ to the time $t_8$, the current 490 (e.g., $I_s$) changes from the value 1320 to the value 1326. For example, the value 1326 is less than zero amps, so the absolute value of the value 1326 represents the magnitude of the current 490, and the negative sign of the value 1326 indicates the current 490 has changed its direction in comparison with the current direction that corresponds to the value 1324 larger than zero amps. In another example, from the time $t_7$ to the time $t_8$, the current 490 changes its direction and increases its magnitude.

As shown by the waveform 1306, at the time $t_8$ of the off-time period $T_9$, the drive signal 494 (e.g., the SR_gate signal) changes from the logic high level to the logic low level, and the switch 410 becomes open (e.g., turned off). For example, the time $t_8$ is the beginning time of a time period $T_{11}$. In another example, the change in the current 490 on the secondary side causes the series resonance between the primary winding 404 and a parasitic capacitor of the switch 430 from the time $t_8$ to the time $t_{10}$.

As shown by the waveform 1310, the voltage drop $V_{ds}$ on the switch 430 decreases from the time $t_8$ to the time $t_{10}$. For example, due to the series resonance between the primary winding 404 and the parasitic capacitor of the switch 430, the voltage drop $V_{ds}$ on the switch 430 decreases from the value 1328 to the value 1322 (e.g., 0 V).

As shown by the waveform 1302, at the time $t_{10}$, the drive signal 482 changes from the logic low level to the logic high level, and the switch 430 becomes closed (e.g., turned on). For example, the time $t_{10}$ is the beginning of another on-time period $T_{12}$ for the drive signal 482. In another example, at the time $t_{10}$, the voltage drop $V_{ds}$ on the switch 430 reaches zero volts, and the switch 430 becomes closed (e.g., turned on), so the zero-voltage turn-on is achieved.

With different values of the input voltage 498, the duration of a delay time period $T_d$ (e.g., from the time $t_7$ to the time $t_8$) often needs to be adjusted in order to turn on the switch 430 at the same time when the voltage drop $V_{ds}$ on the switch 430 becomes zero volts. Therefore, a fixed magnitude of the delay time period $T_d$ usually cannot ensure the zero-voltage turn-on is achieved under different values of the input voltage 498.

Referring to FIG. 4(A) and FIG. 4(B), during the on-time period $T_8$ (e.g., from the time $t_5$ to the time $t_6$), the drive signal 482 is at the logic high level, and the switch 430 is closed (e.g., turned on). For example, at the time $t_5$, the switch 430 becomes closed in response to the drive signal 482 changing to the logic high level. In another example, at the time $t_6$, the switch 430 becomes opened (e.g., turned off) in response to the drive signal 482 changing to the logic low level. During the on-time period $T_8$ (e.g., from the time $t_5$ to the time $t_6$), the current 496 flows through the primary winding 404 towards the switch 430, and then flows through the switch 430 and the resistor 428. Also, during the on-time period $T_8$ (e.g., from the time $t_5$ to the time $t_6$), the primary winding 404 is charged in response to the input voltage 498.

At the time $t_6$, the switch 430 becomes opened (e.g., turned off), and the switch 410 becomes closed (e.g., turned on). From the time $t_6$ to the time $t_7$, the secondary winding 406 discharges to provide the output voltage 480. At the time $t_7$, the discharging of the secondary winding 406 ends and the secondary current 490 reaches the value 1320 (e.g., 0 A).

From the time $t_7$ to the time $t_8$ (e.g., during the delay time period $T_d$), the switch 430 remains open (e.g., turned off), the switch 410 remains closed (e.g., turned on), and the secondary winding 406 is charged by the output voltage 480. During the delay time period $T_d$, the current 490 reverses its direction and increases in magnitude. For example, the current 490 increases in magnitude from zero amps at the time $t_7$ to $I_1$ at the time $t_8$. In another example, $I_1$ is equal to the absolute value of the value 1326.

At the time $t_8$, the switch 410 becomes opened (e.g., turned off) and the magnitude of the current 490 drops to the value 1320 (e.g., 0 A), causing the current 496 to flow from the parasitic capacitor ($C_{ds}$) of the switch 430 to the primary winding 404, and flows through the primary winding 404. For example, at the time $t_8$, the current 490 (e.g., $I_s$) changes from the value 1330 to a value 1333. In another example, the value 1333 is less than zero amps, so the absolute value of the value 1333 represents the magnitude of the current 496, and the negative sign of the value 1333 indicates the current 496 flows in a direction that is different from the current direction that corresponds to the value 1332, which is larger than zero amps.

For example, at the time $t_8$, the current 496 is determined as follows:

$$I_{in} = I_1/N \quad \text{(Equation 2)}$$

Where $I_{in}$ represents the magnitude of the current 496, N represents a turns ratio between the primary winding 404 and the secondary winding 406, and $I_1$ represents the magnitude of the current 490 at the time $t_8$. In another example, at the time $t_8$, the voltage drop between the drain terminal and the source terminal of the transistor 430 is determined as follows:

$$V_{ds} = V_{in} + N \times V_o \quad \text{(Equation 3)}$$

where $V_{ds}$ represents the voltage drop between the drain terminal and the source terminal of the transistor 430, $V_{in}$ represents the input voltage 498 at the time $t_8$, N represents a turns ratio between the primary winding 104 and the secondary winding 106, and $V_o$ represents the output voltage 480 at the time $t_8$.

From the time $t_8$ to the time $t_9$, the current 496 flows from the parasitic capacitor (e.g., $C_{ds}$) of the switch 430 to the primary winding 404 and flows through the primary winding 404. Also, from the time $t_8$ to the time $t_9$, the series resonance occurs between the primary winding 404 and the parasitic capacitor (e.g., $C_{ds}$) of the switch 430 (e.g., a transistor). For example, from the time $t_8$ to the time $t_9$, the voltage drop on the transistor 430 (e.g., the voltage drop $V_{ds}$ across the parasitic capacitor $C_{ds}$ of the transistor 430) is larger than the input voltage 498 in magnitude, so the parasitic capacitor (e.g., $C_{ds}$) of the transistor 430 discharges to the primary winding 404. In another example, from the time $t_8$ to the time $t_9$, the voltage drop (e.g., $V_{ds}$) on the transistor 430 decreases in magnitude, but the magnitude of the current 496 increases.

At the time $t_9$, the voltage drop on the transistor 430 (e.g., the voltage drop $V_{ds}$ across the parasitic capacitor $C_{ds}$ of the transistor 430) becomes equal to the input voltage 498 in magnitude, and the magnitude of the current 496 reaches a maximum, which is the absolute value of a value 1334. Also, at the time $t_9$, the energy stored in the primary winding 404 is determined as follows:

$$E_{ps} = L_p \times I_{in}^2 + C_{ds} \times (N \times V_o)^2 = L_s \times I_1^2 + C_{ds} \times (N \times V_o)^2 \quad \text{(Equation 4)}$$

where $E_{ps}$ represents the energy stored in the primary winding 404 at the time $t_9$. Additionally, $L_p$ represents the inductance of the primary winding 404, $L_s$ represents the inductance of the secondary winding 406, $C_{ds}$ represents the capacitance of the parasitic capacitor of the transistor 430, and N represents the turns ratio between the primary winding 404 and the secondary winding 406. Moreover, $I_{in}$ represents the magnitude of the current 496 at the time $t_8$, $I_1$ represents the magnitude of the current 490 at the time $t_8$, and $V_o$ represents the output voltage 480 at the time $t_8$.

From the time $t_9$ to the time $t_{10}$, the series resonance continues between the primary winding 404 and the parasitic capacitor (e.g., $C_{ds}$) of the switch 430 (e.g., a transistor). For example, from the time $t_9$ to the time $t_{10}$, the voltage drop (e.g., $V_{ds}$) on the transistor 430 continues to decrease, and the magnitude of the current 496 also decreases from the maximum that was reached at the time $t_9$.

At the time $t_{10}$, the magnitude of the current 496 decreases to the value 1330 (e.g., 0 A), and the voltage drop (e.g., $V_{ds}$) on the transistor 430 decreases to the value 1322 (e.g., 0 V). Also, at the time $t_{10}$, the drive signal 482 changes from the logic low level to the logic high level, and the switch 430 becomes closed (e.g., turned on). For example, the voltage drop (e.g., $V_{ds}$) on the transistor 430 equals zero volts at the time $t_{10}$, and the switch 430 becomes closed (e.g., turned on) at the time $t_{10}$, so the zero-voltage turn-on is achieved.

In another example, for the voltage drop (e.g., $V_{ds}$) on the transistor 430 decreases to zero volts at the time $t_{10}$, the following condition needs to be satisfied:

$$L_s \times I_{in}^2 + C_{ds} \times (N \times V_o)^2 \geq C_{ds} \times V_{in}^2 \quad \text{(Equation 5)}$$

where $L_s$ represents the inductance of the secondary winding 406, $C_{ds}$ represents the capacitance of the parasitic capacitor of the transistor 430, and N represents the turns ratio between the primary winding 404 and the secondary winding 406. Additionally, $V_{in}$ represents the magnitude of the input voltage 498 at the time $t_8$, $I_1$ represents the magnitude of the current 490 at the time $t_8$, and $V_o$ represents the output voltage 480 at the time $t_8$.

In yet another example, based on Equation 5, to achieve the zero-voltage turn-on, the maximum magnitude of the current 490 at the time $t_8$ needs to satisfy the following condition:

$$I_1 \geq \sqrt{\frac{C_{ds}}{L_s} \times [V_{in}^2 - (N \times V_o)^2]} \quad \text{(Equation 6)}$$

where $I_1$ represents the magnitude of the current 490 at the time $t_8$, $V_{in}$ represents the magnitude of the input voltage 498 at the time $t_8$, and $V_o$ represents the output voltage 480 at the time $t_8$. Additionally, $L_s$ represents the inductance of the secondary winding 406, $C_{ds}$ represents the capacitance of the parasitic capacitor of the transistor 430, and N represents the turns ratio between the primary winding 404 and the secondary winding 406.

In yet another example, based on Equation 6, to achieve the zero-voltage turn-on, the minimum value for the maximum magnitude of the current 490 at the time $t_8$ is as follows:

$$I_{1,min} = \sqrt{\frac{C_{ds}}{L_s} \times [V_{in}^2 - (N \times V_o)^2]} \quad \text{(Equation 7)}$$

where $I_{1,min}$ represents the minimum value for the magnitude of the current 490 at the time $t_8$, $V_{in}$ represents the magnitude of the input voltage 498 at the time $t_8$, and $V_o$ represents the output voltage 480 at the time $t_8$. Additionally, $L_s$ represents the inductance of the secondary winding 406, $C_{ds}$ represents the capacitance of the parasitic capacitor of the transistor 430, and N represents the turns ratio between the primary winding 404 and the secondary winding 406.

In yet another example, based on Equation 7, the minimum value for the maximum magnitude of the current 490 at the time $t_8$ changes (e.g., non-linearly) with one or more system parameters (e.g., $L_p$, $C_{ds}$, and/or N), and also changes (e.g., non-linearly) with the magnitude of the input voltage 498 at the time $t_8$. In yet another example, to achieve the zero-voltage turn-on with different system parameters and/or under different input voltages, the turn-on voltage of the power switch 430 on the primary side is sampled and the close-loop control is implemented.

But, according to certain embodiments, the zero-voltage turn-on does not always result in the lowest switching loss overall for the power conversion system. For example, to achieve lower turn-on voltage for the switch 430 on the primary side, the higher energy for series resonance is needed; hence, the magnitude of the current 490 (e.g., $I_1$) on the secondary side at the time $t_8$ also needs to be higher.

In another example, with the higher magnitude of the current 490 (e.g., $I_1$) at the time $t_8$ when the switch 410 on the secondary side becomes open (e.g., turned off), the switching loss of the switch 410 on the secondary side and the copper loss of the transformer (e.g., the transformer including the primary winding 404 and the secondary winding 406) increase. In yet another example, under these circumstances, the system efficiency may not be the highest if the turn-on voltage for the switch 430 on the primary side is exactly equal to zero volts.

Figure 5:
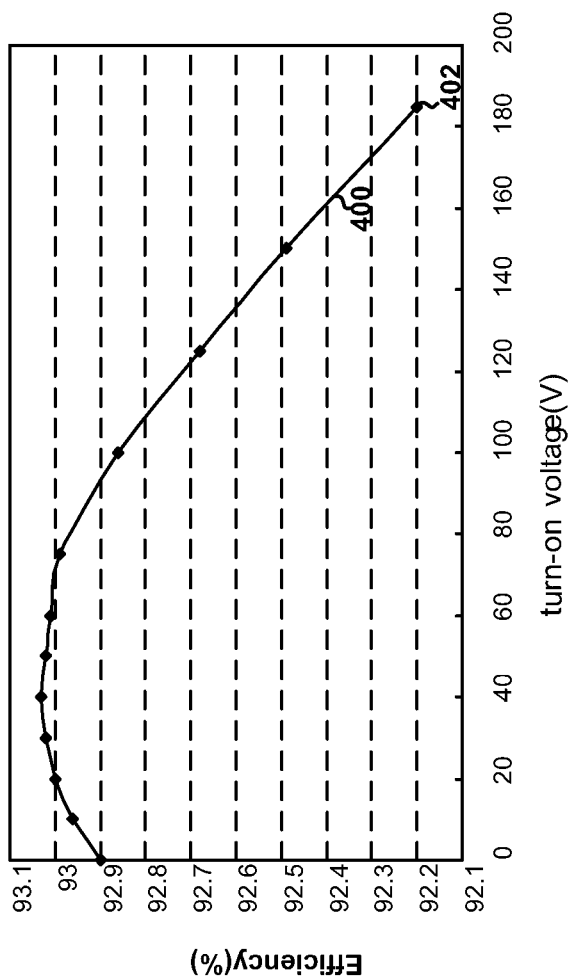
FIG. 5 is a simplified diagram showing a relationship between system efficiency and turn-on voltage of a switch on the primary side of a power conversion system according to some embodiments.

FIG. 5 is a simplified diagram showing a relationship between system efficiency and turn-on voltage of a switch on the primary side of a power conversion system according to some embodiments. For example, the power conversion system can provide an output voltage of 20 V and a maximum output current of 2.25 A under certain circumstances. In another example, the operating frequency of the power conversion system is 200 kHz. In yet another example, the input voltage (e.g., the input voltage 498) is 230 V.

As shown by FIG. 5, the curve 400 shows a relationship between the system efficiency and the turn-on voltage of the switch (e.g., the switch 430) on the primary side of the power conversion system. For example, without any delay between the time $t_8$ and the time $t_{10}$ (e.g., the time $t_7$ being equal to the time $t_{10}$, so the delay time period $T_d$ being equal to zero), the turn-on voltage is equal to 185 V and the corresponding efficiency is 92.2%, as shown by the date point 402. In another example, if the delay time period $T_d$ increases in duration, the turn-on voltage decreases and the efficiency increases. In yet another example, the highest system efficiency appears to occur when the turn-on voltage is close to zero volts (e.g., being at 40 V).

Figure 6:
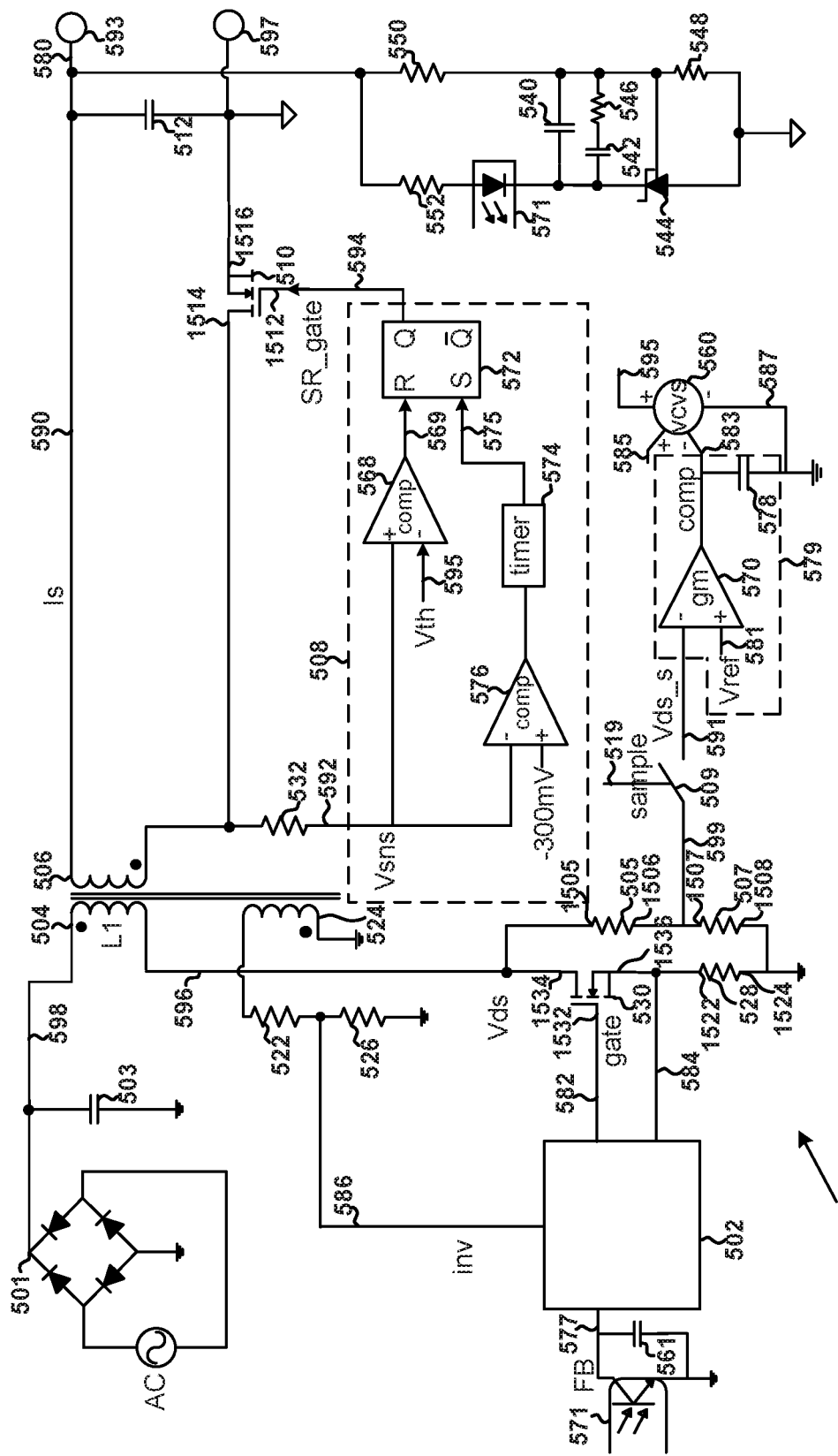
FIG. 6 is a simplified diagram showing certain components of a power conversion system according to an embodiment of the present invention.

FIG. 6 is a simplified diagram showing certain components of a power conversion system 500 according to an embodiment of the present invention. This diagram is merely an example, which should not unduly limit the scope of the claims. One of ordinary skill in the art would recognize many variations, alternatives, and modifications. The power conversion system 500 (e.g., a power converter) includes a rectifying bridge 501, a primary controller 502 (e.g., a chip), a primary winding 504, a secondary winding 506, a secondary controller 508 (e.g., a chip), a switch 510 (e.g., a transistor), an auxiliary winding 524, a current sensing resistor 528, a switch 530 (e.g., a transistor), capacitors 503, 512, 540 and 542, resistors 522, 526, 532, 546, 548, 550 and 552, a shunt regulator 544 (e.g., TL431), an opto-coupler 571, a capacitor 561, resistors 505 and 507, a sampling component 509 (e.g., a switch), a voltage-controlled voltage source 560, and an error amplifier 579.

As shown in FIG. 6, the ground voltage of the primary side is the ground voltage of the chip 502, and the ground voltage of the secondary side is the ground voltage of the chip 508 according to certain embodiments. For example, the ground voltage of the chip 502 is biased to 0 volts. In another example, the ground voltage of the chip 502 is separated from the ground voltage of the chip 508 by at least the onto-coupler 571.

In one embodiment, the transistor 510 includes a gate terminal 1512, a drain terminal 1514, and a source terminal 1516, and the transistor 530 includes a gate terminal 1532, a drain terminal 1534, and a source terminal 1536. For example, the source terminal 1516 of the transistor 510 is biased to the ground voltage of the secondary side, and the source terminal 1536 of the transistor 530 is biased to the ground voltage of the primary side. In another embodiment, the secondary controller 508 includes comparators 568 and 576, a timer 574 (e.g., a 2-μs leading-edge-blanking timer), and a flip-flop 572.

In yet another embodiment, the error amplifier 579 includes a transconductance amplifier 570 and a capacitor 578. For example, the error amplifier 579 serves as a compensation network for the feedback loop that controls the local minimum of the voltage drop (e.g., $V_{ds}$) from the drain terminal 1534 to the source terminal 1536 of the transistor 530 at which the transistor 530 becomes turned on.

In yet another embodiment, the resistor 528 includes terminals 1522 and 1524. For example, the terminal 1522 is connected to the source terminal 1536. In another example, the terminal 1524 is biased to the ground voltage of the primary side. In yet another example, the resistor 505 includes terminals 1505 and 1506, and the resistor 507 includes terminals 1507 and 1508. For example, the terminal 1505 is connected to the drain terminal 1534. In another example, the terminals 1506 and 1507 are connected. In yet another example, the terminal 1508 is biased to the ground voltage of the primary side.

According to one embodiment, a current 596 flows through the primary winding 504. For example, if the transistor 530 is turned off, the magnitude of the current 596 is much smaller because the resistance values of the resistors 505 and 507 are much larger than the resistance value of the resistor 528. In another example, if the transistor 530 is turned on, the magnitude of the current 596 is much larger because the resistance value of the resistor 528 is much smaller than the resistance values of the resistors 505 and 507.

According to another embodiment, if the transistor 530 is turned off, the source terminal 1536 of the transistor 530 is biased to the ground voltage of the primary side, and the voltage of the drain terminal 1534 is equal to the voltage drop (e.g., $V_{ds}$) from the drain terminal 1534 to the source terminal 1536 of the transistor 530. For example, the resistors 505 and 507 serve as a voltage divider, which receives the voltage of the drain terminal 1534 at the terminal 1505 and generates a voltage 599 at the terminals 1506 and 1507 that are connected to each other. In another example, if the transistor 530 is turned off (e.g., before the transistor 530 is turned on), the voltage 599 is proportional to the voltage drop (e.g., $V_{ds}$) from the drain terminal 1534 to the source terminal 1536 of the transistor 530.

According to yet another embodiment, a current 590 flows through the secondary winding 506. For example, if the transistor 510 is turned off, the magnitude of the current 590 is equal to zero. In another example, if the transistor 510 is turned on, the magnitude of the current 590 can be larger than zero.

As discussed above and further emphasized here, FIG. 6 is merely an example, which should not unduly limit the scope of the claims. One of ordinary skill in the art would recognize many variations, alternatives, and modifications. For example, the sampling component 509 and the error amplifier 579 are parts of the primary controller 502. In another example, the voltage-controlled voltage source 560 is a part of the secondary controller 508.

According to one embodiment, if the switch 530 (e.g., a transistor) is closed (e.g., turned on), the energy is stored in the transformer that includes the primary winding 504 and the secondary winding 506. For example, an output voltage 580 is received by a voltage divider that includes the resistors 550 and 548. In another example, through the opto-coupler 571, a feedback signal 577 is generated and sent to the primary controller 502. According to another embodiment, if the switch 530 is open (e.g., turned off), the stored energy of the transformer is transferred to the secondary side, and a demagnetization process begins. For example, during the demagnetization process, the switch 510 (e.g., a transistor) is closed (e.g., turned on). In another example, if the demagnetization process ends, the switch 510 is opened (e.g., turned off), and the series resonance occurs between the primary winding 504 and a parasitic capacitor of the switch 530 (e.g., a transistor).

According to yet another embodiment, when the voltage drop across a parasitic capacitor of the switch 530 (e.g., a transistor) decreases to a low magnitude (e.g., a local minimum), the switch 530 becomes closed (e.g., turned on) in order to reduce switching loss and improve system efficiency. For example, the switch 530 is a transistor including a drain terminal and a source terminal. In another example, when the voltage drop (e.g., $V_{ds}$) from the drain terminal to the source terminal of the transistor 530 decreases to a low magnitude (e.g., a local minimum), the transistor 530 becomes turned on in order to reduce switching loss and improve system efficiency.

Figure 7:
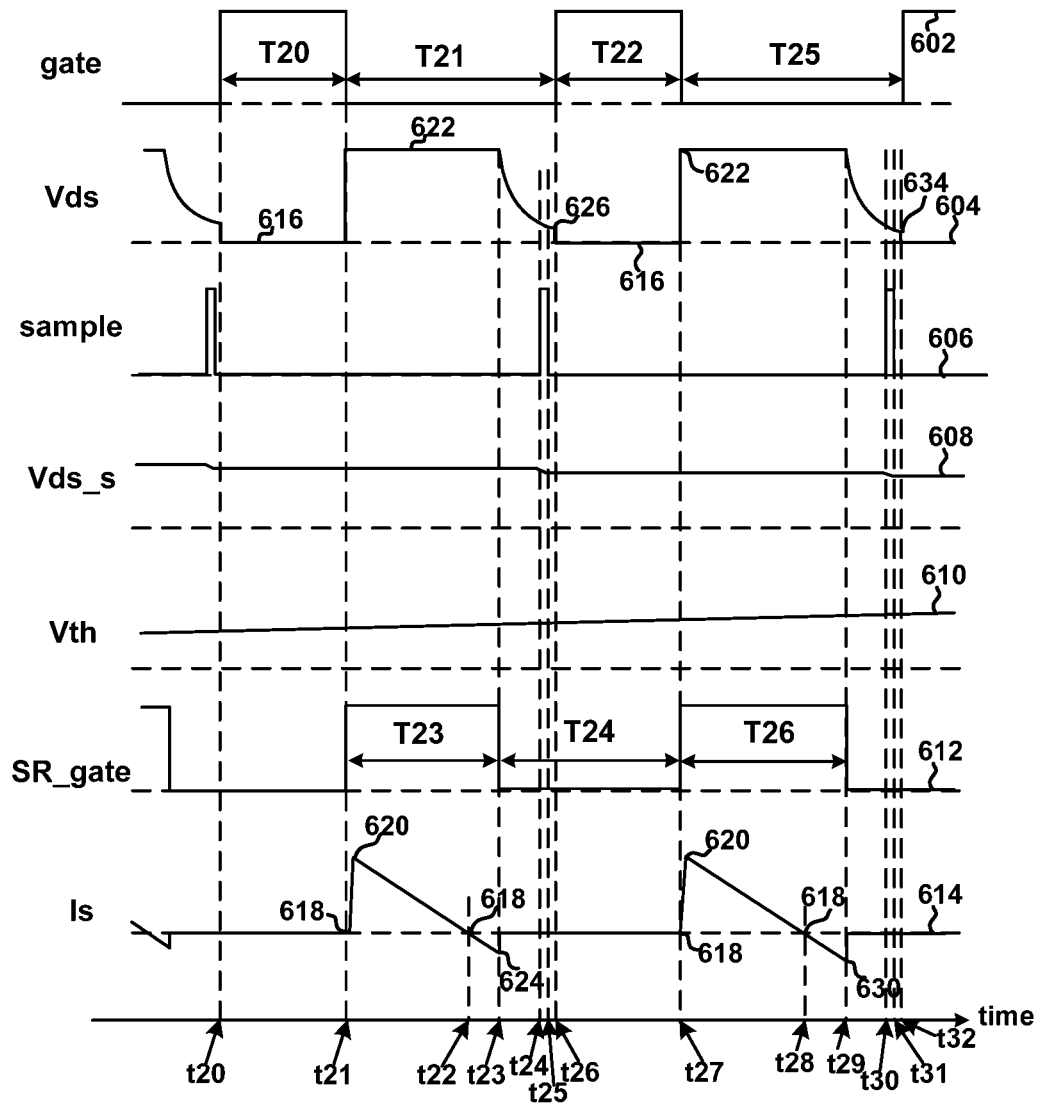
FIG. 7 is a simplified timing diagram for the power conversion system as shown in FIG. 6 according to an embodiment of the present invention.

FIG. 7 is a simplified timing diagram for the power conversion system 500 according to an embodiment of the present invention. This diagram is merely an example, which should not unduly limit the scope of the claims. One of ordinary skill in the art would recognize many variations, alternatives, and modifications. The waveform 602 represents a drive signal 582 as a function of time, the waveform 604 represents a voltage drop (e.g., $V_{ds}$) from the drain terminal to the source terminal of the transistor 530 as a function of time, the waveform 606 represents a sampling signal 519 as a function of time, and the waveform 608 represents a voltage 591 (e.g., $V_{ds\_s}$) as a function of time. In addition, the waveform 610 represents a threshold voltage 595 (e.g., $V_{th}$) as a function of time, the waveform 612 represents a drive signal 594 (e.g., an SR_gate signal) as a function of time, and the waveform 614 represents the current 590 (e.g., $I_s$) as a function of time.

Referring to FIGS. 6 and 7, during an on-time period $T_{20}$ of the drive signal 582 (e.g., from time $t_{20}$ to time $t_{21}$), the drive signal 582 is at a logic high level (e.g., as shown by the waveform 602), and the transistor 530 is turned on, according to some embodiments. For example, during the on-time period $T_{20}$, the drive signal 594 is at a logic low level (e.g., as shown by the waveform 612), and the switch 510 is open (e.g., turned off). In another example, during the on-time period $T_{20}$, the current 596 that flows through the primary winding 504 and a current sensing signal 584 that is generated by the resistor 528 both increase in magnitude. In yet another example, during the on-time period $T_{20}$, the voltage drop (e.g., $V_{ds}$) from the drain terminal to the source terminal of the transistor 530 has a magnitude equal to a value 616 (e.g., 0 V) (e.g., as shown by the waveform 604). In yet another example, during the on-time period $T_2o$, the sampling signal 519 is at the logic low level (e.g., as shown by the waveform 604).

In one embodiment, at the beginning (e.g., at the time $t_{21}$) of an off-time period $T_{21}$ of the drive signal 582 (e.g., from time $t_{21}$ to time $t_{26}$), the drive signal 582 changes from the logic high level to the logic low level (e.g., as shown by the waveform 602), and the transistor 530 becomes open (e.g., turned off). For example, at the time $t_{21}$, the drive signal 594 changes from the logic low level to the logic high level (e.g., as shown by the waveform 612), and the switch 510 becomes closed (e.g., turned on). In another example, during an on-time period $T_{23}$ of the drive signal 594 (e.g., from time $t_{21}$ to time $t_{23}$), the drive signal 594 remains at the logic high level (e.g., as shown by the waveform 612), and the switch 510 remains closed (e.g., turned on). In yet another example, at the time $t_{21}$, the voltage drop (e.g., $V_{ds}$) from the drain terminal to the source terminal of the transistor 530 increases rapidly in magnitude from the value 616 to a value 622 (e.g., a positive value) (e.g., as shown by the waveform 604).

In yet another example, from time $t_{21}$ to time $t_{22}$, the current 590 (e.g., $I_s$) flows from a terminal 597 to a terminal 593 through the switch 510 and the secondary winding 506, and the magnitude of the current 590 (e.g., $I_s$) increases rapidly from a value 618 (e.g., 0 A) to a value 620 (e.g., a positive value) and then decreases from the value 620 back to the value 618. In yet another example, at the time $t_{22}$, the current 590 (e.g., $I_s$) changes its direction and starts to flow from the terminal 593 to the terminal 597 through the secondary winding 506 and the switch 510. In yet another example, from time $t_{22}$ to time $t_{23}$, the current 590 (e.g., $I_s$) flows from the terminal 593 to the terminal 597 through the secondary winding 506 and the switch 510, and the magnitude of the current 590 (e.g., $I_s$) increases from the value 618 (e.g., 0 A) to the absolute value of a value 624, where the value 624 is negative.

In another embodiment, the magnitude of the current 590 (e.g., $I_s$) is represented by a voltage 592 (e.g., $V_{sns}$) that is generated by the resistor 532. For example, the magnitude of the voltage 592 (e.g., $V_{sns}$) is equal to the magnitude of the current 590 (e.g., $I_s$) multiplied by the resistance of the resistor 532. In another example, if the current 590 has a negative value, the voltage 592 has a positive value, and if the current 590 has a positive value, the voltage 592 has a negative value.

In yet another embodiment, the current 590 flows from the terminal 597 to the terminal 593 through the switch 510 and the secondary winding 506 or flows from the terminal 593 to the terminal 597 through the secondary winding 506 and the switch 510. For example, if the current 590 flows from the terminal 597 to the terminal 593 through the switch 510 and the secondary winding 506, the current 590 has a positive value. In another example, if the current 590 flows from the terminal 593 to the terminal 597 through the secondary winding 506 and the switch 510, the current 590 has a negative value. In another example, the value 624 is negative, and the voltage 592 (e.g., $V_{sns}$) is positive at the time $t_{23}$.

As shown in FIG. 6, the comparator 568 receives the voltage 592 (e.g., $V_{sns}$) and the threshold voltage 595 (e.g., $V_{th}$) and outputs a comparison signal 569 to the flip-flop 572, and the flip-flop 572 also receives a signal 575 from the timer 574, and generates the drive signal 594 that is received by the switch 510 (e.g., a transistor), according to some embodiments. For example, the timer 574 and the comparator 576 detect the beginning of the demagnetization process of the transformer that includes the primary winding 504 and the secondary winding 506, and in response, the switch 510 becomes closed (e.g., turned on).

According to one embodiment, at the time $t_{23}$, the voltage 592 (e.g., $V_{sns}$) becomes larger than the threshold voltage 595 (e.g., $V_{th}$), and in response, the drive signal 594 changes from the logic high level to the logic low level (e.g., as shown by the waveform 612) and the switch 510 becomes open (e.g., turned off). For example, during an off-time period $T_{24}$ of the drive signal 594 (e.g., from time $t_{23}$ to time $t_{27}$), the drive signal 594 remains at the logic low level (e.g., as shown by the waveform 612), and the switch 510 remains open (e.g., turned off). In yet another example, from time $t_{23}$ to time $t_{26}$, the drive signal 582 remains at the logic low level (e.g., as shown by the waveform 602), and the transistor 530 remains open (e.g., turned off).

According to another embodiment, at time $t_{24}$, a pulse is generated in the sampling signal 519 (e.g., as shown by the waveform 606). For example, during the pulse (e.g., from time $t_{24}$ to time $t_{25}$), the switch 509 is closed, and the voltage 591 (e.g., $V_{ds\_s}$) is equal to the voltage 599 in magnitude. In another example, during the pulse (e.g., from time $t_{24}$ to time $t_{25}$), the voltage 599 is proportional to the voltage drop (e.g., $V_{ds}$) from the drain terminal to the source terminal of the transistor 530. In yet another example, the voltage 591 (e.g., $V_{ds\_s}$) at the time $t_{25}$ is equal to the voltage 599 at the time $t_{25}$ in magnitude, and the voltage 599 at the time $t_{25}$ is proportional to the voltage drop (e.g., $V_{ds}$) from the drain terminal 1534 to the source terminal 1536 of the transistor 530 at the time $t_{25}$ in magnitude. In yet another example, the voltage 591 (e.g., $V_{ds\_s}$) after the time $t_{25}$ remains equal to the voltage 599 at the time $t_{25}$ in magnitude until another pulse is generated in the sampling signal 519 (e.g., as shown by the waveforms 606 and 608).

As shown in FIG. 6, the voltage 591 is received by the transconductance amplifier 570, which also receives a reference voltage 581 (e.g., $V_{ref}$) according to one embodiment. For example, the transconductance amplifier 570 in response generates a compensation voltage 583 with the capacitor 578. In another example, the compensation voltage 583 is received by the voltage-controlled voltage source 560, which also receives a voltage 585 (e.g., 4 V) and a voltage 587 (e.g., 0 V).

According to another embodiment, the voltage-controlled voltage source 560 generates the threshold voltage 595 (e.g., $V_{th}$). For example, with the voltage 587 being biased to zero volts, the threshold voltage 595 (e.g., $V_{th}$) is determined as follows:

$$V_{th} = K_1 \times (V_p - V_{comp}) \qquad \text{(Equation 8)}$$

where $V_{th}$ represents the threshold voltage 595, $V_p$ represents the voltage 585, and $V_{comp}$ represents the compensation voltage 583. Additionally, $K_1$ represents a predetermined coefficient. For example, $V_p$ is equal to 4 V. In another example, according to Equation 8, the threshold voltage 595 increases with the decreasing compensation voltage 583 and decreases with the increasing compensation voltage 583.

In one embodiment, if the voltage 591 is larger than the reference voltage 581 (e.g., $V_{ref}$) in magnitude, the capacitor 578 is discharged, the compensation voltage 583 (e.g., $V_{comp}$) decreases in magnitude. For example, according to Equation 8, if the compensation voltage 583 (e.g., $V_{comp}$) decreases in magnitude, the threshold voltage 595 (e.g., $V_{th}$) increases in magnitude (e.g., as shown by the waveform 610). In another example, the threshold voltage 595 (e.g., $V_{th}$) becomes larger in magnitude from the time $t_{23}$ to a time $t_{29}$ (e.g., as shown by the waveform 610).

In another embodiment, from time $t_{23}$ to time $t_{26}$, both the drive signals 582 and 594 are at the logic low level (e.g., as shown by the waveforms 602 and 612), and the voltage drop (e.g., $V_{ds}$) from the drain terminal to the source terminal of the transistor 530 decreases in magnitude from the value 622 to a value 626 (e.g., a positive value) (e.g., as shown by the waveform 604). For example, the time $t_{26}$ follows the time $t_{25}$. In another example, the value 626 represents a local minimum for the magnitude of the voltage drop (e.g., $V_{ds}$). In yet another example, at the time $t_{26}$, in response to the voltage drop (e.g., $V_{ds}$) reaching the value 626 as the local minimum, the drive signal 582 changes from the logic low level to the logic high level (e.g., as shown by the waveform 602), and the transistor 530 becomes turned on. In yet another example, at the time $t_{26}$, in response to the transistor 530 being turned on, the voltage drop (e.g., $V_{ds}$) from the drain terminal to the source terminal of the transistor 530 further decreases in magnitude from the value 626 to the value 616 (e.g., as shown by the waveform 604).

During another on-time period $T_{22}$ of the drive signal 582 (e.g., from time $t_{26}$ to time $t_{27}$), the drive signal 582 remains at the logic high level (e.g., as shown by the waveform 602) and the switch 510 remains open (e.g., turned off) according to certain embodiments. For example, at the beginning (e.g., at the time $t_{27}$) of another off-time period $T_{25}$ of the drive signal 582 (e.g., from time $t_{27}$ to time $t_{32}$), the drive signal 582 changes from the logic high level to the logic low level (e.g., as shown by the waveform 602), and the transistor 530 becomes open (e.g., turned off). In another example, at the time $t_{27}$, the drive signal 594 changes from the logic low level to the logic high level (e.g., as shown by the waveform 612), and the switch 510 becomes closed (e.g., turned on).

In one embodiment, during an on-time period $T_{26}$ of the drive signal 594 (e.g., from time $t_{27}$ to time $t_{29}$), the drive signal 594 remains at the logic high level (e.g., as shown by the waveform 612), and the switch 510 remains closed (e.g., turned on). For example, at the time $t_{27}$, the voltage drop (e.g., $V_{ds}$) from the drain terminal to the source terminal of the transistor 530 increases rapidly in magnitude from the value 616 to the value 622 (e.g., as shown by the waveform 604). In yet another example, from time $t_{27}$ to time t28, the current 590 (e.g., $I_s$) flows from the terminal 597 to the terminal 593 through the switch 510 and the secondary winding 506, and the magnitude of the current 590 (e.g., $I_s$) increases rapidly from the value 618 (e.g., 0 A) to the value 620 and then decreases from the value 620 back to the value 618. In yet another example, at the time t28, the current 590 (e.g., $I_s$) changes its direction and starts to flow from the terminal 593 to the terminal 597 through the secondary winding 506 and the switch 510. In yet another example, from time t28 to time $t_{29}$, the current 590 (e.g., $I_s$) flows from the terminal 593 to the terminal 597 through the secondary winding 506 and the switch 510, and the magnitude of the current 590 (e.g., $I_s$) increases from the value 618 (e.g., 0 A) to the absolute value of a value 630, where the value 630 is negative. In yet another example, the value 630 is negative, and the voltage 592 (e.g., $V_{sns}$) is positive at the time $t_{29}$.

In yet another embodiment, at the time $t_{29}$, the voltage 592 (e.g., $V_{sns}$) becomes larger than the threshold voltage 595 (e.g., $V_{th}$) in magnitude, and in response, the drive signal 594 changes from the logic high level to the logic low level (e.g., as shown by the waveform 612), and the switch 510 becomes open (e.g., turned off). For example, the threshold voltage 595 (e.g., $V_{th}$) at the time $t_{29}$ is larger than the threshold voltage 595 (e.g., $V_{th}$) at the time $t_{23}$ (e.g., as shown by the waveform 610), and the absolute value of the value 630 is larger than the absolute value of the value 624 (e.g., as shown by the waveform 614), where both the values 624 and 630 are negative. In another example, the threshold voltage 595 (e.g., $V_{th}$) at the time $t_{29}$ is larger than the threshold voltage 595 (e.g., $V_{th}$) at the time $t_{23}$ (e.g., as shown by the waveform 610), and the on-time period $T_{26}$ of the drive signal 594 is longer than the on-time period $T_{23}$ of the drive signal 594 (e.g., as shown by the waveform 612).

According to one embodiment, at time t30, a pulse is generated in the sampling signal 519 (e.g., as shown by the waveform 606). For example, during the pulse (e.g., from time $t_{30}$ to time $t_{31}$), the switch 509 is closed, and the voltage 591 (e.g., $V_{ds\_s}$) is equal to the voltage 599 in magnitude. In another example, during the pulse (e.g., from time t30 to time $t_{31}$), the voltage 599 is proportional to the voltage drop (e.g., $V_{ds}$) from the drain terminal to the source terminal of the transistor 530. In yet another example, the voltage 591 (e.g., $V_{ds\_s}$) at the time $t_{31}$ is equal to the voltage 599 at the time $t_{31}$ in magnitude, and the voltage 599 at the time $t_{31}$ is proportional to the voltage drop (e.g., $V_{ds}$) from the drain terminal 1534 to the source terminal 1536 of the transistor 530 at the time $t_{31}$ in magnitude. In yet another example, the voltage 591 (e.g., $V_{ds\_s}$) after the time $t_{31}$ remains equal to the voltage 599 at the time $t_{31}$ in magnitude until another pulse is generated in the sampling signal 519 (e.g., as shown by the waveforms 606 and 608).

According to another embodiment, from time $t_{29}$ to time $t_{32}$, both the drive signals 582 and 594 are at the logic low level (e.g., as shown by the waveforms 602 and 612), and the voltage drop (e.g., $V_{ds}$) from the drain terminal to the source terminal of the transistor 530 decreases in magnitude from the value 622 to a value 634 (e.g., a positive value) (e.g., as shown by the waveform 604). For example, the time $t_{32}$ follows the time $t_{31}$. In another example, the value 634 represents a local minimum for the magnitude of the voltage drop (e.g., $V_{ds}$) from the drain terminal to the source terminal of the transistor 530. In yet another example, the absolute value of the value 630 at the time $t_{29}$ is larger than the absolute value of the value 624 at the time $t_{23}$ (e.g., as shown by the waveform 614), so the series resonance between the primary winding 504 and the parasitic capacitor of the transistor 530 that occurs after the time $t_{29}$ has a larger amplitude than the series resonance between the primary winding 504 and the parasitic capacitor of the transistor 530 that occurs after the time $t_{23}$. In yet another example, the value 634, which represents a local minimum for the magnitude of the voltage drop (e.g., $V_{ds}$) at the time $t_{32}$, is smaller than the value 626, which represents an earlier local minimum for the magnitude of the voltage drop (e.g., $V_{ds}$) at the time $t_{26}$. In yet another example, the voltage 591 (e.g., $V_{ds\_s}$) from the time $t_{31}$ until the next pulse is smaller than the voltage 591 (e.g., $V_{ds\_s}$) from the time $t_{25}$ until the time $t_{30}$.

In one embodiment, at the time $t_{32}$, in response to the voltage drop (e.g., $V_{ds}$) reaching the value 634 as the local minimum, the drive signal 582 changes from the logic low level to the logic high level (e.g., as shown by the waveform 602), and the transistor 530 is turned on. For example, at the time $t_{32}$, in response to the transistor 530 being turned on, the voltage drop (e.g., $V_{ds}$) from the drain terminal to the source terminal of the transistor 530 further decreases in magnitude from the value 634 to the value 616 (e.g., as shown by the waveform 604).

In another embodiment, even though the voltage 591 (e.g., $V_{ds\_s}$) from the time $t_{31}$ until the next pulse is smaller than the voltage 591 (e.g., $V_{ds\_s}$) from the time $t_{25}$ until the time $t_{30}$, the voltage 591 (e.g., $V_{ds\_s}$) from the time $t_{31}$ until the next pulse is still larger than the reference voltage 581 (e.g., $V_{ref}$) in magnitude. For example, if the voltage 591 (e.g., $V_{ds\_s}$) from the time $t_{31}$ until the next pulse is larger than the reference voltage 581 (e.g., $V_{ref}$) in magnitude, the capacitor 578 is discharged, the compensation voltage 583 (e.g., $V_{comp}$) decreases in magnitude, and the threshold voltage 595 (e.g., $V_{th}$) increases in magnitude (e.g., as shown by the waveform 610). In another example, the increase of the threshold voltage 595 (e.g., $V_{th}$) also increases the absolute value of the current 590 (e.g., $I_s$) flowing from the terminal 593 to the terminal 597 through the secondary winding 506 and the switch 510, when the drive signal 594 changes from the logic high level to the logic low level (e.g., as shown by the waveform 612) and the switch 510 becomes open (e.g., turned off). In yet another example, the increase of the absolute value of the current 590 (e.g., $I_s$) that flows from the terminal 593 to the terminal 597 decreases the local minimum for the magnitude of the voltage drop (e.g., $V_{ds}$) of the transistor 530, when the drive signal 582 changes from the logic low level to the logic high level (e.g., as shown by the waveform 602) and the transistor 530 is turned on. In yet another example, the decrease of the local minimum for the magnitude of the voltage drop (e.g., $V_{ds}$) of the transistor 530 also decreases the voltage 599, which is proportional to the voltage drop (e.g., $V_{ds}$) of the transistor 530 before the transistor 530 becomes turned on. In yet another example, the decrease of the local minimum for the magnitude of the voltage drop (e.g., $V_{ds}$) of the transistor 530 also decreases the voltage 591 (e.g., $V_{ds\_s}$) that is equal to the voltage 599 during pulses of the sampling signal 519. In yet another embodiment, the voltage 591 (e.g., $V_{ds\_s}$) decreases to become equal to the reference voltage 581 (e.g., $V_{ref}$) in magnitude. For example, if the voltage 591 (e.g., $V_{ds\_s}$) becomes equal to the reference voltage 581 (e.g., $V_{ref}$) in magnitude, the compensation voltage 583 (e.g., $V_{comp}$) becomes stable and constant and the voltage drop (e.g., $V_{ds}$) of the transistor 530 also becomes stable and constant.

As discussed above and further emphasized here, FIG. 7 is merely an example, which should not unduly limit the scope of the claims. One of ordinary skill in the art would recognize many variations, alternatives, and modifications.

According to one embodiment, alternatively, if the voltage 591 (e.g., $V_{ds\_s}$) from the time $t_{31}$ until the next pulse is smaller than the voltage 591 (e.g., $V_{ds\_s}$) from the time $t_{25}$ until the time $t_{30}$, the voltage 591 (e.g., $V_{ds\_s}$) from the time $t_{31}$ until the next pulse becomes smaller than the reference voltage 581 (e.g., $V_{ref}$) in magnitude. For example, if the voltage 591 (e.g., $V_{ds\_s}$) from the time $t_{31}$ until the next pulse is smaller than the reference voltage 581 (e.g., $V_{ref}$) in magnitude, the capacitor 578 is charged, the compensation voltage 583 (e.g., $V_{comp}$) increases in magnitude, and the threshold voltage 595 (e.g., $V_{th}$) decreases in magnitude. In another example, the decrease of the threshold voltage 595 (e.g., $V_{th}$) also decreases the absolute value of the current 590 (e.g., $I_s$) flowing from the terminal 593 to the terminal 597 through the secondary winding 506 and the switch 510, when the drive signal 594 changes from the logic high level to the logic low level and the switch 510 becomes open (e.g., turned off). In yet another example, the decrease of the absolute value of the current 590 (e.g., $I_s$) that flows from the terminal 593 to the terminal 597 increases the local minimum for the magnitude of the voltage drop (e.g., $V_{ds}$) of the transistor 530, when the drive signal 582 changes from the logic low level to the logic high level and the transistor 530 is turned on. In yet another example, the increase of the local minimum for the magnitude of the voltage drop (e.g., $V_{ds}$) of the transistor 530 also increases the voltage 599, which is proportional to the voltage drop (e.g., $V_{ds}$) of the transistor 530 before the transistor 530 becomes turned on. In yet another example, the increase of the local minimum for the magnitude of the voltage drop (e.g., $V_{ds}$) of the transistor 530 also increases the voltage 591 (e.g., $V_{ds\_s}$) that is equal to the voltage 599 during pulses of the sampling signal 519. In yet another example, the voltage 591 (e.g., $V_{ds\_s}$) increases to become equal to the reference voltage 581 (e.g., $V_{ref}$) in magnitude. For example, if the voltage 591 (e.g., $V_{ds\_s}$) becomes equal to the reference voltage 581 (e.g., $V_{ref}$) in magnitude, the compensation voltage 583 (e.g., $V_{comp}$) becomes stable and constant and the voltage drop (e.g., $V_{ds}$) of the transistor 530 also becomes stable and constant.

According to another embodiment, alternatively, if the voltage 591 (e.g., $V_{ds\_s}$) from the time $t_{31}$ until the next pulse is smaller than the voltage 591 (e.g., $V_{ds\_s}$) from the time $t_{25}$ until the time $t_{30}$, the voltage 591 (e.g., $V_{ds\_s}$) from the time $t_{31}$ until the next pulse becomes equal to the reference voltage 581 (e.g., $V_{ref}$) in magnitude. For example, if the voltage 591 (e.g., $V_{ds\_s}$) from the time $t_{31}$ until the next pulse is equal to the reference voltage 581 (e.g., $V_{ref}$) in magnitude, the capacitor 578 is not additionally charged or discharged, the compensation voltage 583 (e.g., $V_{comp}$) does not further change in magnitude, and the threshold voltage 595 (e.g., $V_{th}$) does not change in magnitude. In another example, if the threshold voltage 595 (e.g., $V_{th}$) does not further change, the absolute value of the current 590 (e.g., $I_s$) flowing from the terminal 593 to the terminal 597 through the secondary winding 506 and the switch 510 when the drive signal 594 changes from the logic high level to the logic low level and the switch 510 becomes open (e.g., turned off) also does not change any more. In yet another example, if the absolute value of the current 590 (e.g., $I_s$) that flows from the terminal 593 to the terminal 597 does not change, the local minimum for the magnitude of the voltage drop (e.g., $V_{ds}$) of the transistor 530 when the drive signal 582 changes from the logic low level to the logic high level and the transistor 530 becomes turned on also does not change any more. In yet another example, if the local minimum for the magnitude of the voltage drop (e.g., $V_{ds}$) of the transistor 530 does not change, the voltage 591 (e.g., $V_{ds\_s}$) that is already equal to the reference voltage 581 (e.g., $V_{ref}$) in magnitude also does not change any more, and the operation of the power conversion system 500 (e.g., a power converter) reaches a stable state.

Figure 8:
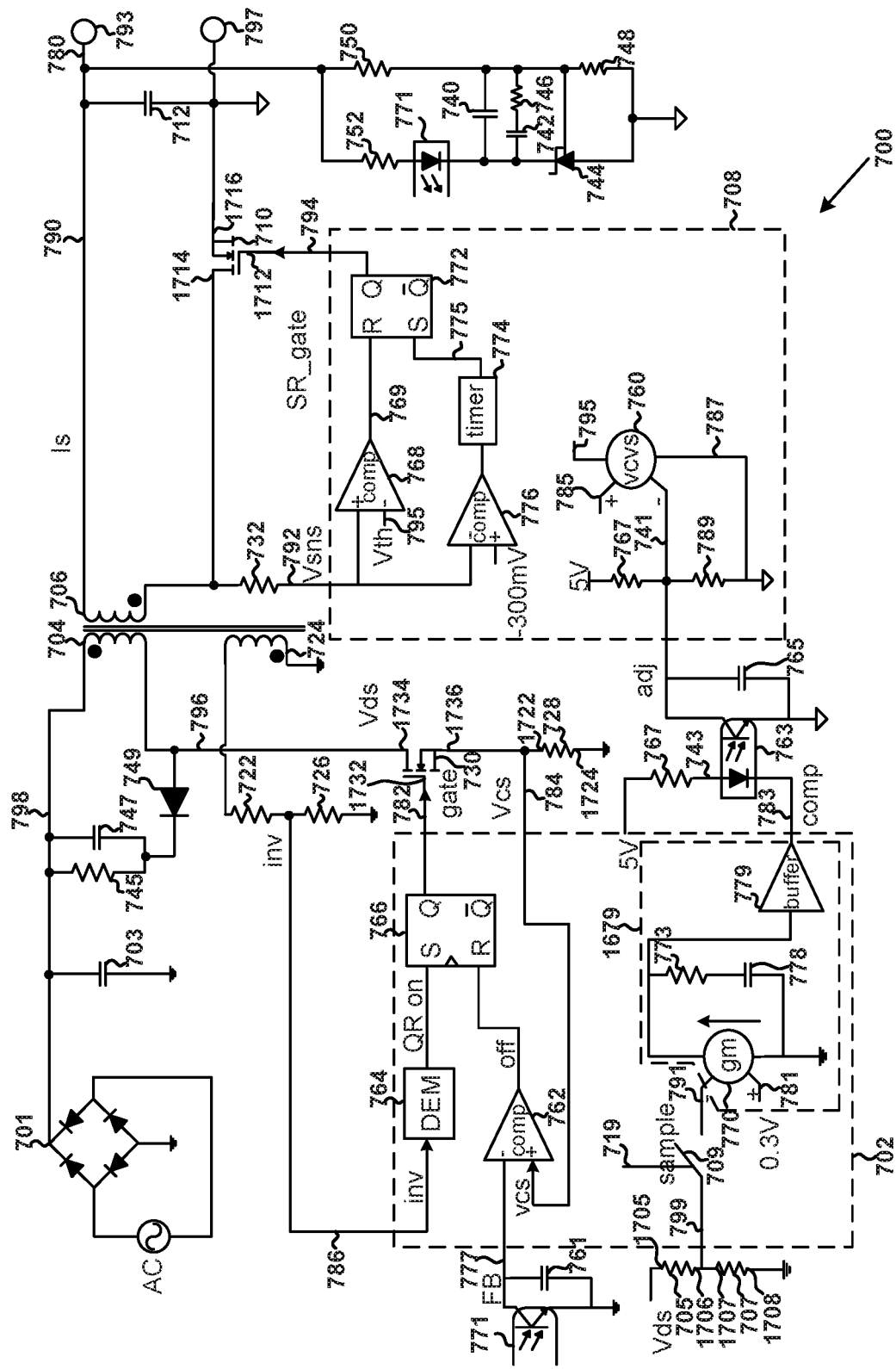
FIG. 8 is a simplified diagram showing a power conversion system according to another embodiment of the present invention.

FIG. 8 is a simplified diagram showing a power conversion system 700 according to another embodiment of the present invention. This diagram is merely an example, which should not unduly limit the scope of the claims. One of ordinary skill in the art would recognize many variations, alternatives, and modifications. The power conversion system 700 (e.g., a power converter) includes a rectifying bridge 701, a primary controller 702 (e.g., a chip), a primary winding 704, a secondary winding 706, a secondary controller 708 (e.g., a chip), a switch 710 (e.g., a transistor), an auxiliary winding 724, a current sensing resistor 728, a switch 730 (e.g., a transistor), capacitors 703, 712, 740, 742, 747, 761 and 765, a shunt regulator 744 (e.g., TL431), resistors 722, 726, 732, 745, 746, 748, 750, 752, and 767, opto-couplers 763 and 771, and resistors 705 and 707.

As shown in FIG. 8, the ground voltage of the primary side is the ground voltage of the chip 702, and the ground voltage of the secondary side is the ground voltage of the chip 708 according to certain embodiments. For example, the ground voltage of the chip 702 is biased to 0 volts. In another example, the ground voltage of the chip 702 is separated from the ground voltage of the chip 708 by at least the opto-couplers 763 and 771.

In one embodiment, the transistor 710 includes a gate terminal 1712, a drain terminal 1714, and a source terminal 1716, and the transistor 730 includes a gate terminal 1732, a drain terminal 1734, and a source terminal 1736. For example, the source terminal 1716 of the transistor 710 is biased to the ground voltage of the secondary side, and the source terminal 1736 of the transistor 730 is biased to the ground voltage of the primary side. In another embodiment, the primary controller 702 includes a demagnetization detector 764, a flip-flop 766, a comparator 762, a sampling component 709 (e.g., a switch), and an error amplifier 1679.

For example, the error amplifier 1679 includes a transconductance amplifier 770, a resistor 773, a capacitor 778, and a buffer 779. In another example, the error amplifier 1679 serves as a compensation network for the feedback loop that controls the local minimum of the voltage drop (e.g., $V_{ds}$) from the drain terminal 1734 to the source terminal 1736 of the transistor 730 at which the transistor 730 becomes turned on.

In yet another example, the resistor 728 includes terminals 1722 and 1724. For example, the terminal 1722 is connected to the source terminal 1736. In another example, the terminal 1724 is biased to the ground voltage of the primary side. In yet another embodiment, the resistor 705 includes terminals 1705 and 1706, and the resistor 707 includes terminals 1707 and 1708. For example, the terminal 1705 is connected to the drain terminal 1734. In another example, the terminals 1706 and 1707 are connected. In yet another example, the terminal 1708 is biased to the ground voltage of the primary side.

According to one embodiment, a current 796 flows through the primary winding 704. For example, if the transistor 730 is turned off, the magnitude of the current 796 is much smaller because the resistance values of the resistors 705 and 707 are much larger than the resistance value of the resistor 728. In another example, if the transistor 730 is turned on, the magnitude of the current 796 is much larger because the resistance value of the resistor 728 is much smaller than the resistance values of the resistors 705 and 707.

According to another embodiment, if the transistor 730 is turned off, the source terminal 1736 of the transistor 730 is biased to the ground voltage of the primary side, and the voltage of the drain terminal 1734 is equal to the voltage drop (e.g., $V_{ds}$) from the drain terminal 1734 to the source terminal 1736 of the transistor 730. For example, the resistors 705 and 707 serve as a voltage divider, which receives the voltage of the drain terminal 1734 at the terminal 1705 and generates a voltage 799 at the terminals 1706 and 1707 that are connected to each other. In another example, if the transistor 730 is turned off (e.g., before the transistor 730 is turned on), the voltage 799 is proportional to the voltage drop (e.g., $V_{ds}$) from the drain terminal 1734 to the source terminal 1736 of the transistor 730.

According to yet another embodiment, a current 790 flows through the secondary winding 706. For example, if the transistor 710 is turned off, the magnitude of the current 790 is equal to zero. In another example, if the transistor 710 is turned on, the magnitude of the current 790 can be larger than zero.

In one embodiment, the secondary controller 708 includes comparators 768 and 776, a timer 774 (e.g., a 2-μs leading-edge-blanking timer), resistors 767 and 789, a voltage-controlled voltage source 760, and a flip-flop 772. In another embodiment, the rectifying bridge 701, the primary winding 704, the secondary winding 706, the auxiliary winding 724, the current sensing resistor 728, the capacitors 703, 712, 740, 742 and 778, the shunt regulator 744, the resistors 722, 726, 732, 746, 748, 750 and 752, the opto-coupler 771, the switches 710 and 730, the sampling component 709, the transconductance amplifier 770, and the voltage-controlled voltage source 760 are the same as the rectifying bridge 501, the primary winding 504, the secondary winding 506, the auxiliary winding 524, the current sensing resistor 528, the capacitors 503, 512, 540, 542 and 578, the shunt regulator 544, the resistors 522, 526, 532, 546, 548, 550 and 552, the opto-coupler 571, the switches 510 and 530, the sampling component 509, the transconductance amplifier 570, and the voltage-controlled voltage source 560, respectively.

According to one embodiment, if the switch 730 (e.g., a transistor) is closed (e.g., turned on), the energy is stored in the transformer that includes the primary winding 704 and the secondary winding 706. For example, an output voltage 780 is received by a voltage divider that includes the resistors 750 and 748. In another example, through the opto-coupler 771, a feedback signal 777 is generated for the primary controller 702. According to another embodiment, if the switch 730 is open (e.g., turned off), the stored energy of the transformer is transferred to the secondary side, and a demagnetization process begins. For example, during the demagnetization process, the switch 710 (e.g., a transistor) is closed (e.g., turned on). In another example, if the demagnetization process ends, the switch 710 is opened (e.g., turned off), and the series resonance occurs between the primary winding 704 and a parasitic capacitor of the switch 730 (e.g., a transistor).

According to yet another embodiment, when the voltage drop across a parasitic capacitor of the switch 730 (e.g., a transistor) decreases to a low magnitude (e.g., a local minimum), the switch 730 becomes closed (e.g., turned on) in order to reduce switching loss and improve system efficiency. For example, the switch 730 is a transistor including a drain terminal and a source terminal. In another example, when the voltage drop (e.g., $V_{ds}$) from the drain terminal to the source terminal of the transistor 730 decreases to a low magnitude (e.g., a local minimum), the transistor 730 becomes turned on in order to reduce switching loss and improve system efficiency.

Figure 9:
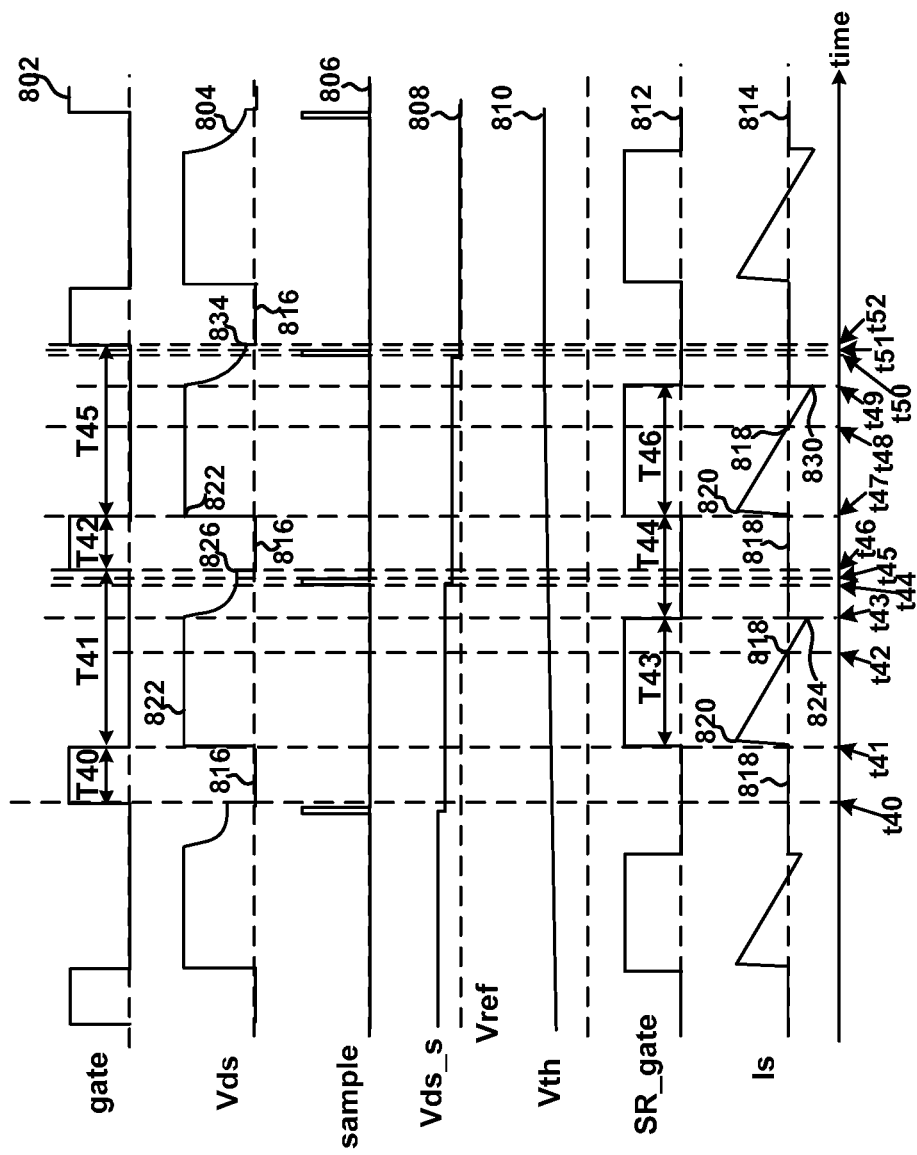
FIG. 9 is a simplified timing diagram for the power conversion system as shown in FIG. 8 according to an embodiment of the present invention.

FIG. 9 is a simplified timing diagram for the power conversion system 700 according to an embodiment of the present invention. This diagram is merely an example, which should not unduly limit the scope of the claims. One of ordinary skill in the art would recognize many variations, alternatives, and modifications. The waveform 802 represents a drive signal 782 as a function of time, the waveform 804 represents a voltage drop (e.g., $V_{ds}$) from the drain terminal to the source terminal of the transistor 730 as a function of time, the waveform 806 represents a sampling signal 719 as a function of time, and the waveform 808 represents a voltage 791 (e.g., $V_{ds\_s}$) as a function of time. In addition, the waveform 810 represents a threshold voltage 795 (e.g., $V_{th}$) as a function of time, the waveform 812 represents a drive signal 794 (e.g., an SR_gate signal) as a function of time, and the waveform 814 represents the current 790 (e.g., $I_s$) as a function of time.

Referring to FIGS. 8 and 9, during an on-time period $T_{40}$ of the drive signal 782 (e.g., from time $t_{40}$ to time $t_{41}$), the drive signal 782 is at a logic high level (e.g., as shown by the waveform 802), and the transistor 730 is turned on, according to some embodiments. For example, during the on-time period $T_{40}$, the drive signal 794 is at a logic low level (e.g., as shown by the waveform 812), and the switch 710 is open (e.g., turned off). In another example, during the on-time period $T_{40}$, the current 796 that flows through the primary winding 704 and a current sensing signal 784 that is generated by the resistor 728 both increase in magnitude. In yet another example, during the on-time period $T_{40}$, the voltage drop (e.g., $V_{ds}$) from the drain terminal to the source terminal of the transistor 730 has a magnitude equal to a value 816 (e.g., 0 A) (e.g., as shown by the waveform 804). In yet another example, during the on-time period $T_{40}$, the sampling signal 719 is at the logic low level (e.g., as shown by the waveform 806).

In one embodiment, at the beginning (e.g., at the time $t_{41}$) of an off-time period $T_{41}$ of the drive signal 782 (e.g., from time $t_{41}$ to time $t_{46}$), the drive signal 782 changes from the logic high level to the logic low level (e.g., as shown by the waveform 802), and the transistor 730 becomes open (e.g., turned off). For example, at the time $t_{41}$, the drive signal 794 changes from the logic low level to the logic high level (e.g., as shown by the waveform 812), and the switch 710 becomes closed (e.g., turned on). In another example, during an on-time period $T_{43}$ of the drive signal 794 (e.g., from time $t_{41}$ to time $t_{43}$), the drive signal 794 remains at the logic high level (e.g., as shown by the waveform 812), and the switch 710 remains closed (e.g., turned on). In yet another example, at the time $t_{41}$, the voltage drop (e.g., $V_{ds}$) from the drain terminal to the source terminal of the transistor 730 increases rapidly in magnitude from the value 816 to a value 822 (e.g., a positive value) (e.g., as shown by the waveform 804).

In yet another example, from time $t_{41}$ to time t42, the current 790 (e.g., $I_s$) flows from a terminal 797 to a terminal 793 through the switch 710 and the secondary winding 706, and the magnitude of the current 790 (e.g., $I_s$) increases rapidly from a value 818 (e.g., 0 A) to a value 820 (e.g., a positive value) and then decreases from the value 820 back to the value 818. In yet another example, at the time t42, the current 790 (e.g., $I_s$) changes its direction and starts to flow from the terminal 793 to the terminal 797 through the secondary winding 706 and the switch 710. In yet another example, from time t42 to time $t_{43}$, the current 790 (e.g., $I_s$) flows from the terminal 793 to the terminal 797 through the secondary winding 706 and the switch 710, and the magnitude of the current 790 (e.g., $I_s$) increases from the value 818 (e.g., 0 A) to the absolute value of a value 824, where the value 824 is negative.

In another embodiment, the magnitude of the current 790 (e.g., $I_s$) is represented by a voltage 792 (e.g., $V_{sns}$) that is generated by the resistor 732. For example, the magnitude of the voltage 792 (e.g., $V_{sns}$) is equal to the magnitude of the current 790 (e.g., $I_s$) multiplied by the resistance of the resistor 732. In another example, if the current 790 has a negative value, the voltage 792 has a positive value, and if the current 790 has a positive value, the voltage 792 has a negative value.

In yet another embodiment, the current 790 flows from the terminal 797 to the terminal 793 through the switch 710 and the secondary winding 706 or flows from the terminal 793 to the terminal 797 through the secondary winding 706 and the switch 710. For example, if the current 790 flows from the terminal 797 to the terminal 793 through the switch 710 and the secondary winding 706, the current 790 has a positive value. In another example, if the current 790 flows from the terminal 793 to the terminal 797 through the secondary winding 706 and the switch 710, the current 790 has a negative value. In yet another example, the value 824 is negative, and the voltage 792 (e.g., $V_{sns}$) is positive at the time $t_{43}$.

As shown in FIG. 8, the comparator 768 receives the voltage 792 (e.g., $V_{sns}$) and the threshold voltage 795 (e.g., $V_{th}$) and outputs a comparison signal 769 to the flip-flop 772, and the flip-flop 772 also receives a signal 775 from the timer 774, and generates the drive signal 794 that is received by the switch 710 (e.g., a transistor) according to some embodiments. For example, the timer 774 and the comparator 776 detect the beginning of the demagnetization process of the transformer that includes the primary winding 704 and the secondary winding 706, and in response, the switch 710 becomes closed (e.g., turned on).

In yet another embodiment, at the time $t_{43}$, the voltage 792 (e.g., $V_{sns}$) becomes larger than the threshold voltage 795 (e.g., $V_{th}$) in magnitude, and in response, the drive signal 794 changes from the logic high level to the logic low level (e.g., as shown by the waveform 812), and the switch 710 becomes open (e.g., turned off). For example, during an off-time period $T_{44}$ of the drive signal 794 (e.g., from time $t_{43}$ to time $t_{47}$), the drive signal 794 remains at the logic low level (e.g., as shown by the waveform 812), and the switch 710 remains open (e.g., turned off). In yet another example, from time $t_{43}$ to time $t_{46}$, the drive signal 782 remains at the logic low level (e.g., as shown by the waveform 802), and the transistor 730 remains open (e.g., turned off).

In yet another embodiment, at time t44, a pulse is generated in the sampling signal 719 (e.g., as shown by the waveform 806). For example, during the pulse (e.g., from time t44 to time t45), the switch 709 is closed, and the voltage 791 (e.g., $V_{ds\_s}$) is equal to a voltage 799 in magnitude. In another example, during the pulse (e.g., from time t44 to time t45), the voltage 799 is proportional to the voltage drop (e.g., $V_{ds}$) from the drain terminal to the source terminal of the transistor 730. In yet another example, the voltage 791 (e.g., $V_{ds\_s}$) at the time t45 is equal to the voltage 799 at the time t45 in magnitude, and the voltage 799 at the time t45 is proportional to the voltage drop (e.g., $V_{ds}$) from the drain terminal 1734 to the source terminal 1736 of the transistor 730 at the time t45 in magnitude. In yet another example, the voltage 791 (e.g., $V_{ds\_s}$) after the time t45 remains equal to the voltage 799 at the time t45 in magnitude until another pulse is generated in the sampling signal 719 (e.g., as shown by the waveforms 806 and 808).

As shown in FIG. 8, the voltage 791 is received by the transconductance amplifier 770, which also receives a reference voltage 781 (e.g., $V_{ref}$) according to one embodiment. For example, the transconductance amplifier 770 in response generates a compensation voltage 783 with the resistor 773, the capacitor 778, and the buffer 779. In another example, the compensation voltage 783 is converted into a current 743 that is received by the opto-coupling component 763, and in response, the opto-coupling component 763 generates an adjustment signal 741 with the capacitor 765 and the resistors 767 and 789. In yet another example, the adjustment signal 741 is received by the voltage-controlled voltage source 760, which also receives a voltage 785 (e.g., 3.5 V) and a voltage 787 (e.g., 0 V).

According to another embodiment, the voltage-controlled voltage source 760 generates the threshold voltage 795 (e.g., $V_{th}$). For example, with the voltage 787 being biased to zero volts, the threshold voltage 795 (e.g., $V_{th}$) is determined as follows:

$$V_{th}=K_2 \times (V_p-V_{adj}) \quad \text{(Equation 9)}$$

where $V_{th}$ represents the threshold voltage 795, $V_p$ represents the voltage 785, and $V_{adj}$ represents the adjustment signal 741. Additionally, $K_2$ represents a predetermined coefficient. In another example, $K_2$ is equal to $K_1$ that appears in Equation 8. In yet another example, $V_p$ is equal to 3.5 V.

In yet another example, the adjustment signal 741 (e.g., $V_{adj}$) increases (e.g., increases proportionally) with the increasing compensation voltage 783 and decreases (e.g., decreases proportionally) with the decreasing compensation voltage 783; and according to Equation 9, the threshold voltage 795 increases with the decreasing compensation voltage 783 and decreases with the increasing compensation voltage 783.

In one embodiment, if the voltage 791 is larger than the reference voltage 781 (e.g., $V_{ref}$) in magnitude, the capacitor 778 is discharged, the compensation voltage 783 (e.g., $V_{comp}$) and the adjustment signal 741 decrease in magnitude, and the threshold voltage 795 (e.g., $V_{th}$) increases in magnitude (e.g., as shown by the waveform 810). For example, according to Equation 9, if the adjustment signal 741 (e.g., Vat) decreases in magnitude, the threshold voltage 795 (e.g., $V_{th}$) increases in magnitude (e.g., as shown by the waveform 810). In another example, the threshold voltage 795 (e.g., $V_{th}$) becomes larger in magnitude from the time $t_{43}$ to a time $t_{49}$ (e.g., as shown by the waveform 810).

In another embodiment, from time $t_{43}$ to time $t_{46}$, both the drive signals 782 and 794 are at the logic low level (e.g., as shown by the waveforms 802 and 812), and the voltage drop (e.g., $V_{ds}$) from the drain terminal to the source terminal of the transistor 730 decreases in magnitude from the value 822 to a value 826 (e.g., a positive value) (e.g., as shown by the waveform 804). For example, the time $t_{46}$ follows the time $t_{45}$. In another example, the value 826 represents a local minimum for the magnitude of the voltage drop (e.g., $V_{ds}$). In yet another example, at the time $t_{46}$, in response to the voltage drop (e.g., $V_{ds}$) reaching the value 826 as the local minimum, the drive signal 782 changes from the logic low level to the logic high level (e.g., as shown by the waveform 802), and the transistor 730 becomes turned on. In yet another example, at the time $t_{46}$, in response to the transistor 730 being turned on, the voltage drop (e.g., $V_{ds}$) from the drain terminal to the source terminal of the transistor 730 further decreases in magnitude from the value 826 to the value 816 (e.g., as shown by the waveform 804).

During another on-time period $T_{42}$ of the drive signal 782 (e.g., from time $t_{46}$ to time $t_{47}$), the drive signal 782 remains at the logic high level (e.g., as shown by the waveform 802) and the switch 710 remains open (e.g., turned off) according to certain embodiments. For example, at the beginning (e.g., at the time $t_{47}$) of another off-time period $T_{45}$ of the drive signal 782 (e.g., from time $t_{47}$ to time $t_{52}$), the drive signal 782 changes from the logic high level to the logic low level (e.g., as shown by the waveform 802), and the transistor 730 becomes open (e.g., turned off). In another example, at the time $t_{47}$, the drive signal 794 changes from the logic low level to the logic high level (e.g., as shown by the waveform 812), and the switch 710 becomes closed (e.g., turned on).

In one embodiment, during an on-time period $T_{46}$ of the drive signal 794 (e.g., from time $t_{47}$ to time $t_{49}$), the drive signal 794 remains at the logic high level (e.g., as shown by the waveform 812), and the switch 710 remains closed (e.g., turned on). For example, at the time $t_{47}$, the voltage drop (e.g., $V_{ds}$) from the drain terminal to the source terminal of the transistor 730 increases rapidly in magnitude from the value 816 to the value 822 (e.g., as shown by the waveform 804). In yet another example, from time $t_{47}$ to time $t_{48}$, the current 790 (e.g., $I_s$) flows from the terminal 797 to the terminal 793 through the switch 710 and the secondary winding 706, and the magnitude of the current 790 (e.g., $I_s$) increases rapidly from the value 818 (e.g., 0 A) to the value 820 and then decreases from the value 820 back to the value 818. In yet another example, at the time $t_{48}$, the current 790 (e.g., $I_s$) changes its direction and starts to flow from the terminal 793 to the terminal 797 through the secondary winding 706 and the switch 710. In yet another example, from time $t_{48}$ to time $t_{49}$, the current 790 (e.g., $I_s$) flows from the terminal 793 to the terminal 797 through the secondary winding 706 and the switch 710, and the magnitude of the current 790 (e.g., $I_s$) increases from the value 818 (e.g., 0 A) to the absolute value of a value 830, where the value 830 is negative. In yet another example, the value 830 is negative, and the voltage 792 (e.g., $V_{sns}$) is positive at the time $t_{49}$.

In yet another embodiment, at the time $t_{49}$, the voltage 792 (e.g., $V_{sns}$) becomes larger than the threshold voltage 795 (e.g., $V_{th}$) in magnitude, and in response, the drive signal 794 changes from the logic high level to the logic low level (e.g., as shown by the waveform 812), and the switch 710 becomes open (e.g., turned off). For example, the threshold voltage 795 (e.g., $V_{th}$) at the time $t_{49}$ is larger than the threshold voltage 795 (e.g., $V_{th}$) at the time $t_{43}$ (e.g., as shown by the waveform 810), and the absolute value of the value 830 is larger than the absolute value of the value 824 (e.g., as shown by the waveform 814), where both the values 824 and 830 are negative. In another example, the threshold voltage 795 (e.g., $V_{th}$) at the time $t_{49}$ is larger than the threshold voltage 795 (e.g., $V_{th}$) at the time $t_{43}$ (e.g., as shown by the waveform 810), and the on-time period $T_{46}$ of the drive signal 794 is longer than the on-time period $T_{43}$ of the drive signal 794 (e.g., as shown by the waveform 812).

According to one embodiment, at time $t_{50}$, a pulse is generated in the sampling signal 719 (e.g., as shown by the waveform 806). For example, during the pulse (e.g., from time $t_{50}$ to time $t_{51}$), the switch 709 is closed, and the voltage 791 (e.g., $V_{ds\_s}$) is equal to the voltage 799 in magnitude. In another example, during the pulse (e.g., from time $t_{50}$ to time $t_{51}$), the voltage 799 is proportional to the voltage drop (e.g., $V_{ds}$) from the drain terminal to the source terminal of the transistor 730. In yet another example, the voltage 791 (e.g., $V_{ds\_s}$) at the time $t_{51}$ is equal to the voltage 799 at the time $t_{51}$ in magnitude, and the voltage 799 at the time $t_{51}$ is proportional to the voltage drop (e.g., $V_{ds}$) from the drain terminal 1734 to the source terminal 1736 of the transistor 730 at the time $t_{51}$ in magnitude. In yet another example, the voltage 791 (e.g., $V_{ds\_s}$) after the time $t_{51}$ remains equal to the voltage 799 at the time $t_{51}$ in magnitude until another pulse is generated in the sampling signal 719 (e.g., as shown by the waveforms 806 and 808).

According to another embodiment, from time $t_{49}$ to time $t_{52}$, both the drive signals 782 and 794 are at the logic low level (e.g., as shown by the waveforms 802 and 812), and the voltage drop (e.g., $V_{ds}$) from the drain terminal to the source terminal of the transistor 730 decreases in magnitude from the value 822 to a value 834 (e.g., a positive value) (e.g., as shown by the waveform 804). For example, the time $t_{52}$ follows the time $t_{51}$. In another example, the value 834 represents a local minimum for the magnitude of the voltage drop (e.g., $V_{ds}$) from the drain terminal to the source terminal of the transistor 730. In yet another example, the absolute value of the value 830 at the time $t_{49}$ is larger than the absolute value of the value 824 at the time $t_{43}$ (e.g., as shown by the waveform 814), so the series resonance between the primary winding 704 and the parasitic capacitor of the transistor 730 that occurs after the time $t_{49}$ has a larger amplitude than the series resonance between the primary winding 704 and the parasitic capacitor of the transistor 730 that occurs after the time $t_{43}$. In yet another example, the value 834, which represents a local minimum for the magnitude of the voltage drop (e.g., $V_{ds}$) at the time $t_{52}$, is smaller than the value 826, which represents an earlier local minimum for the magnitude of the voltage drop (e.g., $V_{ds}$) at the time $t_{46}$. In yet another example, the voltage 791 (e.g., $V_{ds\_s}$) from the time $t_{51}$ until the next pulse is smaller than the voltage 791 (e.g., $V_{ds\_s}$) from the time $t_{45}$ until the time $t_{50}$.

In one embodiment, at the time $t_{52}$, in response to the voltage drop (e.g., $V_{ds}$) reaching the value 834 as the local minimum, the drive signal 782 changes from the logic low level to the logic high level (e.g., as shown by the waveform 802), and the transistor 730 is turned on. For example, at the time $t_{52}$, in response to the transistor 730 being turned on, the voltage drop (e.g., $V_{ds}$) from the drain terminal to the source terminal of the transistor 730 further decreases in magnitude from the value 834 to the value 816 (e.g., as shown by the waveform 804).

In another embodiment, the voltage 791 (e.g., $V_{ds\_s}$) from the time $t_{51}$ until the next pulse is smaller than the voltage 791 (e.g., $V_{ds\_s}$) from the time $t_{45}$ until the time $t_{50}$, and the voltage 791 (e.g., $V_{ds\_s}$) from the time $t_{51}$ until the next pulse is equal to the reference voltage 781 (e.g., $V_{ref}$) in magnitude (e.g., as shown by the waveform 808). For example, the voltage 791 (e.g., $V_{ds\_s}$) from the time $t_{51}$ until the next pulse is equal to the reference voltage 781 (e.g., $V_{ref}$) in magnitude, so the capacitor 778 is not additionally charged or discharged, the compensation voltage 783 (e.g., $V_{comp}$) does not further change in magnitude, and the threshold voltage 795 (e.g., $V_{th}$) does not further change in magnitude (e.g., as shown by the waveform 810). In another example, the threshold voltage 795 (e.g., $V_{th}$) does not change, so the absolute value of the current 790 (e.g., $I_s$) flowing from the terminal 793 to the terminal 797 through the secondary winding 706 and the switch 710 when the drive signal 794 changes from the logic high level to the logic low level and the switch 710 becomes open (e.g., turned off) also does not change any more (e.g., as shown by the waveform 814). In yet another example, the absolute value of the current 790 (e.g., $I_s$) that flows from the terminal 793 to the terminal 797 does not change, so the local minimum for the magnitude of the voltage drop (e.g., $V_{ds}$) of the transistor 730 when the drive signal 782 changes from the logic low level to the logic high level and the transistor 730 becomes turned on also does not change any more (e.g., as shown by the waveform 804). In yet another example, the local minimum for the magnitude of the voltage drop (e.g., $V_{ds}$) of the transistor 730 does not change, so the voltage 799, which is proportional to the voltage drop (e.g., $V_{ds}$) of the transistor 730 before the transistor 730 becomes turned on, also does not change. In yet another example, the local minimum for the magnitude of the voltage drop (e.g., $V_{ds}$) of the transistor 730 does not change, so the voltage 791 (e.g., $V_{ds\_s}$) that is already equal to the reference voltage 781 (e.g., $V_{ref}$) in magnitude also does not change any more, and the operation of the power conversion system 700 (e.g., a power converter) reaches a stable state.

Figure 10:
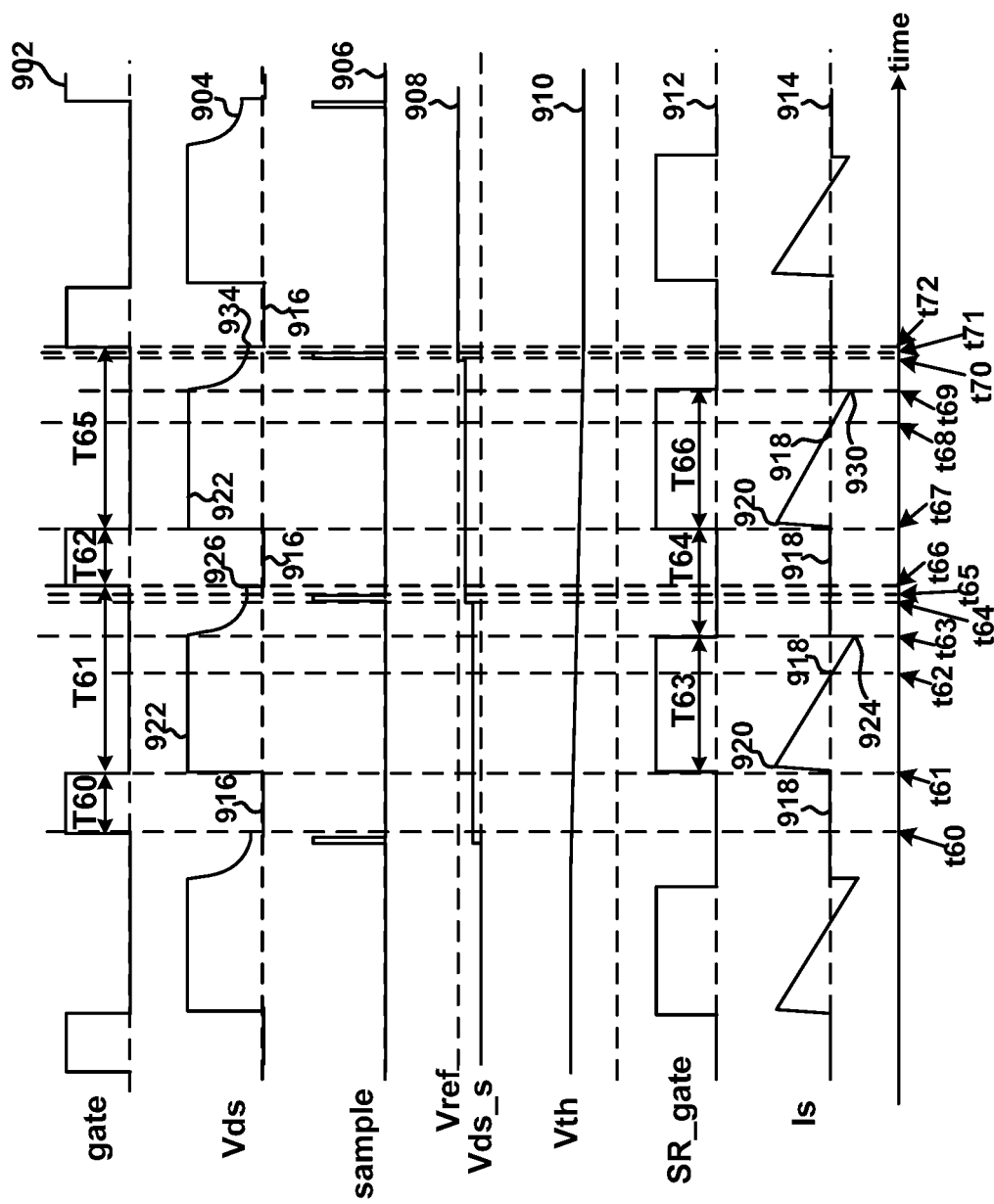
FIG. 10 is a simplified timing diagram for the power conversion system as shown in FIG. 8 according to another embodiment of the present invention.

FIG. 10 is a simplified timing diagram for the power conversion system 700 according to another embodiment of the present invention. This diagram is merely an example, which should not unduly limit the scope of the claims. One of ordinary skill in the art would recognize many variations, alternatives, and modifications. The waveform 902 represents the drive signal 782 as a function of time, the waveform 904 represents the voltage drop (e.g., $V_{ds}$) from the drain terminal to the source terminal of the transistor 730 as a function of time, the waveform 906 represents the sampling signal 719 as a function of time, and the waveform 908 represents the voltage 791 (e.g., $V_{ds\_s}$) as a function of time. In addition, the waveform 910 represents the threshold voltage 795 (e.g., $V_{th}$) as a function of time, the waveform 912 represents the drive signal 794 (e.g., the SR_gate signal) as a function of time, and the waveform 914 represents the current 790 (e.g., $I_s$) as a function of time.

Referring to FIGS. 8 and 10, during an on-time period $T_{60}$ of the drive signal 782 (e.g., from time $t_{60}$ to time $t_{61}$), the drive signal 782 is at the logic high level (e.g., as shown by the waveform 902), and the transistor 730 is turned on, according to some embodiments. For example, during the on-time period $T_{60}$, the drive signal 794 is at the logic low level (e.g., as shown by the waveform 912), and the switch 710 is open (e.g., turned off). In another example, during the on-time period $T_{60}$, the current 796 that flows through the primary winding 704 and the current sensing signal 784 that is generated by the resistor 728 both increase in magnitude. In yet another example, during the on-time period $T_{60}$, the voltage drop (e.g., $V_{ds}$) from the drain terminal to the source terminal of the transistor 730 has a magnitude equal to a value 916 (e.g., 0 A) (e.g., as shown by the waveform 904). In yet another example, during the on-time period $T_{60}$, the sampling signal 719 is at the logic low level (e.g., as shown by the waveform 906).

In one embodiment, at the beginning (e.g., at the time $t_{61}$) of an off-time period $T_{61}$ of the drive signal 782 (e.g., from time $t_{61}$ to time t66), the drive signal 782 changes from the logic high level to the logic low level (e.g., as shown by the waveform 902), and the transistor 730 becomes open (e.g., turned off). For example, at the time $t_{61}$, the drive signal 794 changes from the logic low level to the logic high level (e.g., as shown by the waveform 912), and the switch 710 becomes closed (e.g., turned on). In another example, during an on-time period $T_{63}$ of the drive signal 794 (e.g., from time $t_{61}$ to time t63), the drive signal 794 remains at the logic high level (e.g., as shown by the waveform 912), and the switch 710 remains closed (e.g., turned on). In yet another example, at the time $t_{61}$, the voltage drop (e.g., $V_{ds}$) from the drain terminal to the source terminal of the transistor 730 increases rapidly in magnitude from the value 916 to a value 922 (e.g., a positive value) (e.g., as shown by the waveform 904).

In yet another example, from time $t_{61}$ to time t62, the current 790 (e.g., $I_s$) flows from the terminal 797 to the terminal 793 through the switch 710 and the secondary winding 706, and the magnitude of the current 790 (e.g., $I_s$) increases rapidly from a value 918 (e.g., 0 A) to a value 920 (e.g., a positive value) and then decreases from the value 920 back to the value 918. In yet another example, at the time t62, the current 790 (e.g., $I_s$) changes its direction and starts to flow from the terminal 793 to the terminal 797 through the secondary winding 706 and the switch 710. In yet another example, from time t62 to time t63, the current 790 (e.g., $I_s$) flows from the terminal 793 to the terminal 797 through the secondary winding 706 and the switch 710, and the magnitude of the current 790 (e.g., $I_s$) increases from the value 918 (e.g., 0 A) to the absolute value of a value 924, where the value 924 is negative.

In another embodiment, the magnitude of the current 790 (e.g., $I_s$) is represented by the voltage 792 (e.g., $V_{sns}$) that is generated by the resistor 732. For example, the magnitude of the voltage 792 (e.g., $V_{sns}$) is equal to the magnitude of the current 790 (e.g., $I_s$) multiplied by the resistance of the resistor 732. In another example, if the current 790 has a negative value, the voltage 792 has a positive value, and if the current 790 has a positive value, the voltage 792 has a negative value.

In yet another embodiment, the current 790 flows from the terminal 797 to the terminal 793 through the switch 710 and the secondary winding 706 or flows from the terminal 793 to the terminal 797 through the secondary winding 706 and the switch 710. For example, if the current 790 flows from the terminal 797 to the terminal 793 through the switch 710 and the secondary winding 706, the current 790 has a positive value. In another example, if the current 790 flows from the terminal 793 to the terminal 797 through the secondary winding 706 and the switch 710, the current 790 has a negative value. In yet another example, the value 924 is negative, and the voltage 792 (e.g., $V_{sns}$) is positive at the time $t_{63}$.

As shown in FIG. 8, the comparator 768 receives the voltage 792 (e.g., $V_{sns}$) and the threshold voltage 795 (e.g., $V_{th}$) and outputs the comparison signal 769 to the flip-flop 772, and the flip-flop 772 also receives the signal 775 from the timer 774, and generates the drive signal 794 that is received by the switch 710 (e.g., a transistor) according to some embodiments. For example, the timer 774 and the comparator 776 detect the beginning of the demagnetization process of the transformer that includes the primary winding 704 and the secondary winding 706, and in response, the switch 710 becomes closed (e.g., turned on).

In yet another embodiment, at the time $t_{63}$, the voltage 792 (e.g., $V_{sns}$) becomes larger than the threshold voltage 795 (e.g., $V_{th}$) in magnitude, and in response, the drive signal 794 changes from the logic high level to the logic low level (e.g., as shown by the waveform 912), and the switch 710 becomes open (e.g., turned off). For example, during an off-time period $T_{64}$ of the drive signal 794 (e.g., from time $t_{63}$ to time $t_{67}$), the drive signal 794 remains at the logic low level (e.g., as shown by the waveform 912), and the switch 710 remains open (e.g., turned off). In yet another example, from time $t_{63}$ to time $t_{66}$, the drive signal 782 remains at the logic low level (e.g., as shown by the waveform 902), and the transistor 730 remains open (e.g., turned off).

In yet another embodiment, at time $t_{64}$, a pulse is generated in the sampling signal 719 (e.g., as shown by the waveform 906). For example, during the pulse (e.g., from time $t_{64}$ to time $t_{65}$), the switch 709 is closed, and the voltage 791 (e.g., $V_{ds\_s}$) is equal to the voltage 799 in magnitude. In another example, during the pulse (e.g., from time $t_{64}$ to time $t_{65}$), the voltage 799 is proportional to the voltage drop (e.g., $V_{ds}$) from the drain terminal to the source terminal of the transistor 730. In yet another example, the voltage 791 (e.g., $V_{ds\_s}$) at the time $t_{65}$ is equal to the voltage 799 at the time $t_{65}$ in magnitude, and the voltage 799 at the time $t_{65}$ is proportional to the voltage drop (e.g., $V_{ds}$) from the drain terminal 1734 to the source terminal 1736 of the transistor 730 at the time $t_{65}$ in magnitude. In yet another example, the voltage 791 (e.g., $V_{ds\_s}$) after the time $t_{65}$ remains equal to the voltage 799 at the time $t_{65}$ in magnitude until another pulse is generated in the sampling signal 719 (e.g., as shown by the waveforms 906 and 908).

As shown in FIG. 8, the voltage 791 is received by the transconductance amplifier 770, which also receives the reference voltage 781 (e.g., $V_{ref}$) according to one embodiment. For example, the transconductance amplifier 770 in response generates the compensation voltage 783 with the resistor 773, the capacitor 778, and the buffer 779. In another example, the compensation voltage 783 is converted into the current 743 that is received by the opto-coupling component 763, and in response, the opto-coupling component 763 generates the adjustment signal 741 with the capacitor 765 and the resistors 767 and 789. In yet another example, the adjustment signal 741 is received by the voltage-controlled voltage source 760, which also receives the voltage 785 (e.g., 3.5 V) and the voltage 787 (e.g., 0 V).

According to another embodiment, the voltage-controlled voltage source 760 generates the threshold voltage 795 (e.g., $V_{th}$). For example, with the voltage 787 being biased to zero volts, the threshold voltage 795 (e.g., $V_{th}$) is determined according to Equation 9.

In one embodiment, if the voltage 791 is smaller than the reference voltage 781 (e.g., $V_{ref}$) in magnitude, the capacitor 778 is charged, the compensation voltage 783 (e.g., $V_{comp}$) and the adjustment signal 741 increase in magnitude, and the threshold voltage 795 (e.g., $V_{th}$) decreases in magnitude (e.g., as shown by the waveform 910). For example, according to Equation 9, if the adjustment signal 741 (e.g., Vat) increases in magnitude, the threshold voltage 795 (e.g., $V_{th}$) decreases in magnitude (e.g., as shown by the waveform 910). In another example, the threshold voltage 795 (e.g., $V_{th}$) becomes smaller in magnitude from the time $t_{63}$ to a time $t_{69}$ (e.g., as shown by the waveform 910).

In another embodiment, from time $t_{63}$ to time $t_{66}$, both the drive signals 782 and 794 are at the logic low level (e.g., as shown by the waveforms 902 and 912), and the voltage drop (e.g., $V_{ds}$) from the drain terminal to the source terminal of the transistor 730 decreases in magnitude from the value 922 to a value 926 (e.g., a positive value) (e.g., as shown by the waveform 904). For example, the time $t_{66}$ follows the time $t_{65}$. In another example, the value 926 represents a local minimum for the magnitude of the voltage drop (e.g., $V_{ds}$). In yet another example, at the time $t_{66}$, in response to the voltage drop (e.g., $V_{ds}$) reaching the value 926 as the local minimum, the drive signal 782 changes from the logic low level to the logic high level (e.g., as shown by the waveform 902), and the transistor 730 becomes turned on. In yet another example, at the time $t_{66}$, in response to the transistor 730 being turned on, the voltage drop (e.g., $V_{ds}$) from the drain terminal to the source terminal of the transistor 730 further decreases in magnitude from the value 926 to the value 916 (e.g., as shown by the waveform 904).

During another on-time period $T_{62}$ of the drive signal 782 (e.g., from time $t_{66}$ to time $t_{67}$), the drive signal 782 remains at the logic high level (e.g., as shown by the waveform 902) and the switch 710 remains open (e.g., turned off) according to certain embodiments. For example, at the beginning (e.g., at the time $t_{67}$) of another off-time period $T_{65}$ of the drive signal 782 (e.g., from time $t_{67}$ to time $t_{72}$), the drive signal 782 changes from the logic high level to the logic low level (e.g., as shown by the waveform 902), and the transistor 730 becomes open (e.g., turned off). In another example, at the time $t_{67}$, the drive signal 794 changes from the logic low level to the logic high level (e.g., as shown by the waveform 912), and the switch 710 becomes closed (e.g., turned on).

In one embodiment, during an on-time period $T_{66}$ of the drive signal 794 (e.g., from time $t_{67}$ to time $t_{69}$), the drive signal 794 remains at the logic high level (e.g., as shown by the waveform 912), and the switch 710 remains closed (e.g., turned on). For example, at the time $t_{67}$, the voltage drop (e.g., $V_{ds}$) from the drain terminal to the source terminal of the transistor 730 increases rapidly in magnitude from the value 916 to the value 922 (e.g., as shown by the waveform 904). In yet another example, from time $t_{67}$ to time $t_{68}$, the current 790 (e.g., $I_s$) flows from the terminal 797 to the terminal 793 through the switch 710 and the secondary winding 706, and the magnitude of the current 790 (e.g., $I_s$) increases rapidly from the value 918 (e.g., 0 A) to the value 920 and then decreases from the value 920 back to the value 918. In yet another example, at the time $t_{68}$, the current 790 (e.g., $I_s$) changes its direction and starts to flow from the terminal 793 to the terminal 797 through the secondary winding 706 and the switch 710. In yet another example, from time $t_{68}$ to time $t_{69}$, the current 790 (e.g., $I_s$) flows from the terminal 793 to the terminal 797 through the secondary winding 706 and the switch 710, and the magnitude of the current 790 (e.g., $I_s$) increases from the value 918 (e.g., 0 A) to the absolute value of a value 930, where the value 930 is negative. In yet another example, the value 930 is negative, and the voltage 792 (e.g., $V_{sns}$) is positive at the time $t_{69}$.

In yet another embodiment, at the time $t_{69}$, the voltage 792 (e.g., $V_{sns}$) becomes larger than the threshold voltage 795 (e.g., $V_{th}$) in magnitude, and in response, the drive signal 794 changes from the logic high level to the logic low level (e.g., as shown by the waveform 912), and the switch 710 becomes open (e.g., turned off). For example, the threshold voltage 795 (e.g., $V_{th}$) at the time $t_{69}$ is smaller than the threshold voltage 795 (e.g., $V_{th}$) at the time $t_{63}$ (e.g., as shown by the waveform 910), and the absolute value of the value 930 is smaller than the absolute value of the value 924 (e.g., as shown by the waveform 914), where both the values 924 and 930 are negative. In another example, the threshold voltage 795 (e.g., $V_{th}$) at the time $t_{69}$ is smaller than the threshold voltage 795 (e.g., $V_{th}$) at the time $t_{63}$ (e.g., as shown by the waveform 910), and the on-time period $T_{66}$ of the drive signal 794 is shorter than the on-time period $T_{63}$ of the drive signal 794 (e.g., as shown by the waveform 912).

According to one embodiment, at time $t_{70}$, a pulse is generated in the sampling signal 719 (e.g., as shown by the waveform 906). For example, during the pulse (e.g., from time $t_{70}$ to time $t_{71}$), the switch 709 is closed, and the voltage 791 (e.g., $V_{ds\_s}$) is equal to the voltage 799 in magnitude. In another example, during the pulse (e.g., from time $t_{70}$ to time $t_{71}$), the voltage 799 is proportional to the voltage drop (e.g., $V_{ds}$) from the drain terminal to the source terminal of the transistor 730. In yet another example, the voltage 791 (e.g., $V_{ds\_s}$) at the time $t_{71}$ is equal to the voltage 799 at the time $t_{71}$ in magnitude, and the voltage 799 at the time $t_{71}$ is proportional to the voltage drop (e.g., $V_{ds}$) from the drain terminal 1734 to the source terminal 1736 of the transistor 730 at the time $t_{71}$ in magnitude. In yet another example, the voltage 791 (e.g., $V_{ds\_s}$) after the time $t_{71}$ remains equal to the voltage 799 at the time $t_{71}$ in magnitude until another pulse is generated in the sampling signal 719 (e.g., as shown by the waveforms 906 and 908).

According to another embodiment, from time $t_{69}$ to time $t_{72}$, both the drive signals 782 and 794 are at the logic low level (e.g., as shown by the waveforms 902 and 912), and the voltage drop (e.g., $V_{ds}$) from the drain terminal to the source terminal of the transistor 730 decreases in magnitude from the value 922 to a value 934 (e.g., a positive value) (e.g., as shown by the waveform 904). For example, the time $t_{72}$ follows the time $t_{71}$. In another example, the value 934 represents a local minimum for the magnitude of the voltage drop (e.g., $V_{ds}$) from the drain terminal to the source terminal of the transistor 730. In yet another example, the absolute value of the value 930 at the time $t_{69}$ is smaller than the absolute value of the value 924 at the time $t_{63}$ (e.g., as shown by the waveform 914), so the series resonance between the primary winding 704 and the parasitic capacitor of the transistor 730 that occurs after the time $t_{69}$ has a smaller amplitude than the series resonance between the primary winding 704 and the parasitic capacitor of the transistor 730 that occurs after the time $t_{63}$. In yet another example, the value 934, which represents a local minimum for the magnitude of the voltage drop (e.g., $V_{ds}$) at the time $t_{72}$, is larger than the value 926, which represents an earlier local minimum for the magnitude of the voltage drop (e.g., $V_{ds}$) at the time $t_{66}$. In yet another example, the voltage 791 (e.g., $V_{ds\_s}$) from the time $t_{71}$ until the next pulse is larger than the voltage 791 (e.g., $V_{ds\_s}$) from the time $t_{65}$ until the time $t_{70}$.

In one embodiment, at the time $t_{72}$, in response to the voltage drop (e.g., $V_{ds}$) reaching the value 934 as the local minimum, the drive signal 782 changes from the logic low level to the logic high level (e.g., as shown by the waveform 902), and the transistor 730 is turned on. For example, at the time $t_{72}$, in response to the transistor 730 being turned on, the voltage drop (e.g., $V_{ds}$) from the drain terminal to the source terminal of the transistor 730 further decreases in magnitude from the value 934 to the value 916 (e.g., as shown by the waveform 904).

In another embodiment, the voltage 791 (e.g., $V_{ds\_s}$) from the time $t_{71}$ until the next pulse is larger than the voltage 791 (e.g., $V_{ds\_s}$) from the time $t_{65}$ until the time $t_{70}$, and the voltage 791 (e.g., $V_{ds\_s}$) from the time $t_{71}$ until the next pulse is equal to the reference voltage 781 (e.g., $V_{ref}$) in magnitude (e.g., as shown by the waveform 908). For example, the voltage 791 (e.g., $V_{ds\_s}$) from the time $t_{71}$ until the next pulse is equal to the reference voltage 781 (e.g., $V_{ref}$) in magnitude, so the capacitor 778 is not additionally charged or discharged, the compensation voltage 783 (e.g., $V_{comp}$) does not further change in magnitude, and the threshold voltage 795 (e.g., $V_{th}$) does not further change in magnitude (e.g., as shown by the waveform 910). In another example, the threshold voltage 795 (e.g., $V_{th}$) does not change, so the absolute value of the current 790 (e.g., $I_s$) flowing from the terminal 793 to the terminal 797 through the secondary winding 706 and the switch 710 when the drive signal 794 changes from the logic high level to the logic low level and the switch 710 becomes open (e.g., turned off) also does not change any more (e.g., as shown by the waveform 914). In yet another example, the absolute value of the current 790 (e.g., $I_s$) that flows from the terminal 793 to the terminal 797 does not change, so the local minimum for the magnitude of the voltage drop (e.g., $V_{ds}$) of the transistor 730 when the drive signal 782 changes from the logic low level to the logic high level and the transistor 730 becomes turned on also does not change any more (e.g., as shown by the waveform 904). In yet another example, the local minimum for the magnitude of the voltage drop (e.g., $V_{ds}$) of the transistor 730 does not change, so the voltage 799, which is proportional to the voltage drop (e.g., $V_{ds}$) of the transistor 730 before the transistor 730 becomes turned on, also does not change. In yet another example, the local minimum for the magnitude of the voltage drop (e.g., $V_{ds}$) of the transistor 730 does not change, so the voltage 791 (e.g., $V_{ds\_s}$) that is already equal to the reference voltage 781 (e.g., $V_{ref}$) in magnitude also does not change any more, and the operation of the power conversion system 700 (e.g., a power converter) reaches a stable state.

According to another embodiment, a power converter (e.g., the power converter 500 and/or the power converter 700) includes a primary winding (e.g., the primary winding 504 and/or the primary winding 704), and a secondary winding (e.g., the secondary winding 506 and/or the secondary winding 706) coupled to the primary winding. Additionally, the power converter includes a first switch (e.g., the transistor 530 and/or the transistor 730) including a first switch terminal (e.g., the drain terminal 1534 and/or the drain terminal 1734), a second switch terminal (e.g., the source terminal 1536 and/or the source terminal 1736), and a third switch terminal (e.g., the gate terminal 1532 and/or the gate terminal 1732). The first switch is configured to affect a first current (e.g., the current 596 and/or the current 796) associated with the primary winding. The first switch terminal (e.g., the drain terminal 1534 and/or the drain terminal 1734) corresponds to a first voltage, and the second switch terminal (e.g., the source terminal 1536 and/or the source terminal 1736) corresponds to a second voltage. The first voltage minus the second voltage is equal to a voltage difference (e.g., $V_{ds}$). Moreover, the power converter includes a second switch (e.g., the switch 510 and/or the switch 710) including a fourth switch terminal, a fifth switch terminal, and a sixth switch terminal and configured to affect a second current (e.g., the current 590 and/or the current 790) associated with the secondary winding. Also, the power converter includes a sampled-voltage generator (e.g., the switch 509 and/or the switch 709) configured to sample a third voltage (e.g., the voltage 599 and/or the voltage 799) before the first switch becomes closed (e.g., before time $t_{26}$, before time $t_{46}$, and/or before time $t_{66}$) and generate a sampled voltage (e.g., the voltage 591 and/or the voltage 791) based at least in part on the third voltage (e.g., the voltage 599 and/or the voltage 799). The third voltage is related to the voltage difference before the first switch becomes closed (e.g., before time $t_{26}$, before time $t_{46}$, and/or before time $t_{66}$). Additionally, the power converter includes an error amplifier (e.g., the error amplifier 579 and/or the error amplifier 1679) configured to receive the sampled voltage and a reference voltage (e.g., the reference voltage 581 and/or the reference voltage 781) and generate an amplified voltage (e.g., the compensation voltage 583 and/or the compensation voltage 783) based at least in part on the sampled voltage and the reference voltage. Moreover, the power converter includes a threshold voltage generator (e.g., the voltage-controlled voltage source 560 and/or the voltage-controlled voltage source 760) configured to generate a threshold voltage based on at least information associated with the amplified voltage (e.g., generate the threshold voltage 595 based on at least information associated with the compensation voltage 583, and/or generate the threshold voltage 795 based on at least information associated with the compensation voltage 783). Also, the power converter includes a drive signal generator configured to receive the threshold voltage (e.g., the threshold voltage 595 and/or the threshold voltage 795) and a fourth voltage (e.g., the voltage 592 and/or the voltage 792), generate a drive signal (e.g., the drive signal 594 and/or the drive signal 794) based at least in part on the threshold voltage and the fourth voltage, and output the drive signal to the second switch, the fourth voltage representing the second current. The drive signal generator is further configured to, in response to the fourth voltage becoming larger than the threshold voltage, generate the drive signal to open the second switch (e.g., in response to the voltage 592 becoming larger than the threshold voltage 595, generate the drive signal 594 to open the switch 510; and/or in response to the voltage 792 becoming larger than the threshold voltage 795, generate the drive signal 794 to open the switch 710). The power converter is configured to, in response to the sampled voltage and the reference voltage not being equal, change the threshold voltage with time (e.g., in response to the voltage 591 and the reference voltage 581 not being equal, change the threshold voltage 595 with time; and/or in response to the voltage 791 and the reference voltage 781 not being equal, change the threshold voltage 795 with time). For example, the power converter (e.g., the power converter 500 and/or the power converter 700) is implemented according to at least FIG. 6, FIG. 7, FIG. 8, FIG. 9, and/or FIG. 10.

In another example, the power converter (e.g., the power converter 500 and/or the power converter 700) is further configured, in response to the sampled voltage being larger than the reference voltage, increase the threshold voltage with time (e.g., as shown by the waveform 610, in response to the voltage 591 being larger than the reference voltage 581, increase the threshold voltage 595 with time; and/or as shown by the waveform 810, in response to the voltage 791 being larger than the reference voltage 781, increase the threshold voltage 795 with time). In yet another example, the power converter (e.g., the power converter 500 and/or the power converter 700) is further configured to cause the sampled voltage to decrease with the increasing threshold voltage (e.g., as shown by the waveforms 608 and 610, to cause the voltage 591 to decrease with the increasing threshold voltage 595; and/or as shown by the waveforms 808 and 810, to cause the voltage 791 to decrease with the increasing threshold voltage 795).

In yet another example, the power converter (e.g., the power converter 500 and/or the power converter 700) is further configured, in response to the sampled voltage being smaller than the reference voltage, decrease the threshold voltage with time (e.g., in response to the voltage 591 being smaller than the reference voltage 581, decrease the threshold voltage 595 with time; and/or as shown by the waveform 910, in response to the voltage 791 being smaller than the reference voltage 781, decrease the threshold voltage 795 with time). In yet another example, the power converter (e.g., the power converter 500 and/or the power converter 700) is further configured to cause the sampled voltage to increase with the decreasing threshold voltage (e.g., to cause the voltage 591 to increase with the decreasing threshold voltage 595; and/or as shown by the waveforms 908 and 910, to cause the voltage 791 to increase with the decreasing threshold voltage 795).

In yet another example, the power converter (e.g., the power converter 500 and/or the power converter 700) is further configured to, in response to the sampled voltage and the reference voltage being equal, keep the threshold voltage constant with time (e.g., in response to the voltage 591 and the reference voltage 581 being equal, keep the threshold voltage 595 constant with time; as shown by the waveform 810, in response to the voltage 791 and the reference voltage 781 being equal, keep the threshold voltage 795 constant with time; and/or as shown by the waveforms 910, in response to the voltage 791 and the reference voltage 781 being equal, keep the threshold voltage 795 constant with time). In yet another example, the power converter (e.g., the power converter 500 and/or the power converter 700) is further configured to cause the sampled voltage to remain constant in response to the constant threshold voltage (e.g., to cause the voltage 591 to remain constant in response to the constant threshold voltage 595; as shown by the waveforms 808 and 810, to cause the voltage 791 to remain constant in response to the constant threshold voltage 795; and/or as shown by the waveforms 908 and 910, to cause the voltage 791 to remain constant in response to the constant threshold voltage 795).

In yet another example, the drive signal generator includes a comparator (e.g., the comparator 568 and/or the comparator 768) configured to receive the threshold voltage (e.g., the threshold voltage 595 and/or the threshold voltage 795) and the fourth voltage (e.g., the voltage 592 and/or the voltage 792) and generate a comparison signal based at least in part on the threshold voltage and the fourth voltage (e.g., generate the comparison signal 569 based at least in part on the threshold voltage 595 and the voltage 592, and/or generate the comparison signal 769 based at least in part on the threshold voltage 795 and the voltage 792), and a flip-flop (e.g., the flip-flop 572 and/or the flip-flop 772) configured to receive the comparison signal (e.g., the comparison signal 569 and/or the comparison signal 769) and generate the drive signal based at least in part on the comparison signal (e.g., generate the drive signal 594 based at least in part on the comparison signal 569, and/or generate the drive signal 794 based at least in part on the comparison signal 769).

In yet another example, the first switch (e.g., the transistor 530 and/or the transistor 730) is further configured to affect the first current (e.g., the current 596 and/or the current 796) flowing through the primary winding, the second switch (e.g., the switch 510 and/or the switch 710) is further configured to affect the second current (e.g., the current 590 and/or the current 790) flowing through the secondary winding, and the drive signal generator is further configured to receive the fourth voltage (e.g., the voltage 592 and/or the voltage 792), the fourth voltage being proportional to the second current. In yet another example, the threshold voltage generator (e.g., the voltage-controlled voltage source 560 and/or the voltage-controlled voltage source 760) is further configured to increase the threshold voltage in response to the decreasing amplified voltage (e.g., as shown by Equation 8, and/or as shown by Equation 9), and decrease the threshold voltage in response to the increasing amplified voltage (e.g., as shown by Equation 8, and/or as shown by Equation 9).

According to yet another embodiment, a controller (e.g., the primary controller 502 and/or the primary controller 702) for a power converter (e.g., the power converter 500 and/or the power converter 700) includes a sampled-voltage generator (e.g., the switch 509 and/or the switch 709) configured to sample a first voltage (e.g., the voltage 599 and/or the voltage 799) before a first switch (e.g., the transistor 530 and/or the transistor 730) becomes closed (e.g., before time $t_{26}$, before time $t_{46}$, and/or before time $t_{66}$) and generate a sampled voltage (e.g., the voltage 591 and/or the voltage 791) based at least in part on the first voltage (e.g., the voltage 599 and/or the voltage 799). The first voltage is related to a voltage difference before the first switch becomes closed (e.g., before time $t_{26}$, before time $t_{46}$, and/or before time $t_{66}$). The first switch includes a first switch terminal (e.g., the drain terminal 1534 and/or the drain terminal 1734), a second switch terminal (e.g., the source terminal 1536 and/or the source terminal 1736), and a third switch terminal (e.g., the gate terminal 1532 and/or the gate terminal 1732), and is configured to affect a first current (e.g., the current 596 and/or the current 796) associated with a primary winding (e.g., the primary winding 504 and/or the primary winding 704) of the power converter. The first switch terminal (e.g., the drain terminal 1534 and/or the drain terminal 1734) corresponds to a second voltage, and the second switch terminal (e.g., the source terminal 1536 and/or the source terminal 1736) corresponds to a third voltage. The voltage difference (e.g., $V_{ds}$) is equal to the second voltage minus the third voltage. Additionally, the controller (e.g., the primary controller 502 and/or the primary controller 702) includes an error amplifier (e.g., the error amplifier 579 and/or the error amplifier 1679) configured to receive the sampled voltage and a reference voltage (e.g., the reference voltage 581 and/or the reference voltage 781), generate an amplified voltage (e.g., the compensation voltage 583 and/or the compensation voltage 783) based at least in part on the sampled voltage and the reference voltage, and output the amplified voltage in order for a threshold voltage generator (e.g., the voltage-controlled voltage source 560 and/or the voltage-controlled voltage source 760) to generate a threshold voltage (e.g., the threshold voltage 595 and/or the threshold voltage 795). The threshold voltage generator is configured to generate the threshold voltage based on at least information associated with the amplified voltage (e.g., generate the threshold voltage 595 based on at least information associated with the compensation voltage 583, and/or generate the threshold voltage 795 based on at least information associated with the compensation voltage 783), and output the threshold voltage to a drive signal generator. The drive signal generator is configured to receive the threshold voltage (e.g., the threshold voltage 595 and/or the threshold voltage 795) and a fourth voltage (e.g., the voltage 592 and/or the voltage 792), generate a drive signal (e.g., the drive signal 594 and/or the drive signal 794) based at least in part on the threshold voltage and the fourth voltage, the fourth voltage representing a second current (e.g., the current 590 and/or the current 790) associated with a secondary winding (e.g., the secondary winding 506 and/or the secondary winding 706) of the power converter, the secondary winding coupled to the primary winding, and output the drive signal to a second switch. The second switch (e.g., the switch 510 and/or the switch 710) includes a fourth switch terminal, a fifth switch terminal, and a sixth switch terminal, and is configured to affect the second current. The drive signal generator is further configured to, in response to the fourth voltage becoming larger than the threshold voltage, generate the drive signal to open the second switch (e.g., in response to the voltage 592 becoming larger than the threshold voltage 595, generate the drive signal 594 to open the switch 510; and/or in response to the voltage 792 becoming larger than the threshold voltage 795, generate the drive signal 794 to open the switch 710). The controller is configured to, in response to the sampled voltage and the reference voltage not being equal, generate the amplified voltage to change the threshold voltage with time (e.g., generate the compensation voltage 583 to change the threshold voltage 595 with time, and/or generate the compensation voltage 783 to change the threshold voltage 795 with time). For example, the controller (e.g., the primary controller 502 and/or the primary controller 702) is implemented according to at least FIG. 6, FIG. 7, FIG. 8, FIG. 9, and/or FIG. 10.

For example, the controller is further configured, in response to the sampled voltage being larger than the reference voltage, generate the amplified voltage to increase the threshold voltage with time (e.g., as shown by the waveform 610, in response to the voltage 591 being larger than the reference voltage 581, generate the compensation voltage 583 to increase the threshold voltage 595 with time; and/or as shown by the waveform 810, in response to the voltage 791 being larger than the reference voltage 781, generate the compensation voltage 783 to increase the threshold voltage 795 with time). In another example, the sampled voltage decreases with the increasing threshold voltage (e.g., as shown by the waveforms 608 and 610, the voltage 591 decreases with the increasing threshold voltage 595; and/or as shown by the waveforms 808 and 810, the voltage 791 decreases with the increasing threshold voltage 795).

In another example, the controller is further configured, in response to the sampled voltage being smaller than the reference voltage, generate the amplified voltage to decrease the threshold voltage with time (e.g., in response to the voltage 591 being smaller than the reference voltage 581, generate the compensation voltage 583 to decrease the threshold voltage 595 with time; and/or as shown by the waveform 910, in response to the voltage 791 being smaller than the reference voltage 781, generate the compensation voltage 783 to decrease the threshold voltage 795 with time). In yet another example, the sampled voltage increases with the decreasing threshold voltage (e.g., the voltage 591 increases with the decreasing threshold voltage 595; and/or as shown by the waveforms 908 and 910, the voltage 791 increases with the decreasing threshold voltage 795).

In yet another example, the controller is further configured to, in response to the sampled voltage and the reference voltage being equal, generate the amplified voltage to keep the threshold voltage constant with time (e.g., in response to the voltage 591 and the reference voltage 581 being equal, generate the compensation voltage 583 to keep the threshold voltage 595 constant with time; as shown by the waveform 810, in response to the voltage 791 and the reference voltage 781 being equal, generate the compensation voltage 783 to keep the threshold voltage 795 constant with time; and/or as shown by the waveforms 910, in response to the voltage 791 and the reference voltage 781 being equal, generate the compensation voltage 783 to keep the threshold voltage 795 constant with time). In yet another example, the sampled voltage remains constant in response to the constant threshold voltage (e.g., the voltage 591 remains constant in response to the constant threshold voltage 595; as shown by the waveforms 808 and 810, the voltage 791 remains constant in response to the constant threshold voltage 795; and/or as shown by the waveforms 908 and 910, the voltage 791 remains constant in response to the constant threshold voltage 795).

According to yet another embodiment, a controller (e.g., the secondary controller 508 and/or the secondary controller 708) for a power converter (e.g., the power converter 500 and/or the power converter 700) includes a threshold voltage generator (e.g., the voltage-controlled voltage source 560 and/or the voltage-controlled voltage source 760) configured to generate a threshold voltage based on at least information associated with an amplified voltage generated by an error amplifier (e.g., generate the threshold voltage 595 based on at least information associated with the compensation voltage 583 generated by the error amplifier 579, and/or generate the threshold voltage 795 based on at least information associated with the compensation voltage 783 generated by the error amplifier 1679). Additionally, the controller (e.g., the secondary controller 508 and/or the secondary controller 708) includes a drive signal generator configured to receive the threshold voltage (e.g., the threshold voltage 595 and/or the threshold voltage 795) and a first voltage (e.g., the voltage 592 and/or the voltage 792), generate a drive signal (e.g., the drive signal 594 and/or the drive signal 794) based at least in part on the threshold voltage and the first voltage, and output the drive signal to a first switch (e.g., the switch 510 and/or the switch 710). The first voltage represents a first current (e.g., the current 590 and/or the current 790). The first switch includes a first switch terminal, a second switch terminal, and a third switch terminal, and is configured to affect the first current associated with a secondary winding (e.g., the secondary winding 506 and/or the secondary winding 706) coupled to a primary winding (e.g., the primary winding 504 and/or the primary winding 704) of the power converter. The error amplifier (e.g., the error amplifier 579 and/or the error amplifier 1679) is configured to receive a sampled voltage (e.g., the voltage 591 and/or the voltage 791) from a sampled-voltage generator (e.g., the switch 509 and/or the switch 709) and a reference voltage (e.g., the reference voltage 581 and/or the reference voltage 781), and generate the amplified voltage (e.g., the compensation voltage 583 and/or the compensation voltage 783) based at least in part on the sampled voltage and the reference voltage. The sampled-voltage generator (e.g., the switch 509 and/or the switch 709) is configured to sample a second voltage (e.g., the voltage 599 and/or the voltage 799) before a second switch (e.g., the transistor 530 and/or the transistor 730) becomes closed (e.g., before time $t_{26}$, before time $t_{46}$, and/or before time $t_{66}$), and generate the sampled voltage (e.g., the voltage 591 and/or the voltage 791) based at least in part on the second voltage (e.g., the voltage 599 and/or the voltage 799). The second voltage is related to a voltage difference before the second switch becomes closed (e.g., before time $t_{26}$, before time $t_{46}$, and/or before time $t_{66}$). The second switch includes a fourth switch terminal (e.g., the drain terminal 1534 and/or the drain terminal 1734), a fifth switch terminal (e.g., the source terminal 1536 and/or the source terminal 1736), and a sixth switch terminal (e.g., the gate terminal 1532 and/or the gate terminal 1732). The second switch is configured to affect a second current (e.g., the current 596 and/or the current 796) associated with the primary winding. The fourth switch terminal (e.g., the drain terminal 1534 and/or the drain terminal 1734) corresponds to a third voltage, and the fifth switch terminal (e.g., the source terminal 1536 and/or the source terminal 1736) corresponds to a fourth voltage. The third voltage minus the fourth voltage is equal to the voltage difference (e.g., $V_{ds}$). The drive signal generator is further configured to, in response to the first voltage becoming larger than the threshold voltage, generate the drive signal to open the first switch (e.g., in response to the voltage 592 becoming larger than the threshold voltage 595, generate the drive signal 594 to open the switch 510; and/or in response to the voltage 792 becoming larger than the threshold voltage 795, generate the drive signal 794 to open the switch 710). The threshold voltage generator (e.g., the voltage-controlled voltage source 560 and/or the voltage-controlled voltage source 760) is further configured to, in response to the sampled voltage and the reference voltage not being equal, change the threshold voltage with time (e.g., in response to the voltage 591 and the reference voltage 581 not being equal, change the threshold voltage 595 with time; and/or in response to the voltage 791 and the reference voltage 781 not being equal, change the threshold voltage 795 with time). For example, the controller (e.g., the secondary controller 508 and/or the secondary controller 708) is implemented according to at least FIG. 6, FIG. 7, FIG. 8, FIG. 9, and/or FIG. 10.

In another example, the controller is further configured, in response to the sampled voltage being larger than the reference voltage, increase the threshold voltage with time (e.g., as shown by the waveform 610, in response to the voltage 591 being larger than the reference voltage 581, increase the threshold voltage 595 with time; and/or as shown by the waveform 810, in response to the voltage 791 being larger than the reference voltage 781, increase the threshold voltage 795 with time). In yet another example, the sampled voltage decreases with the increasing threshold voltage (e.g., as shown by the waveforms 608 and 610, the voltage 591 decreases with the increasing threshold voltage 595; and/or as shown by the waveforms 808 and 810, the voltage 791 decreases with the increasing threshold voltage 795).

In yet another example, the controller is further configured, in response to the sampled voltage being smaller than the reference voltage, decrease the threshold voltage with time (e.g., in response to the voltage 591 being smaller than the reference voltage 581, decrease the threshold voltage 595 with time; and/or as shown by the waveform 910, in response to the voltage 791 being smaller than the reference voltage 781, decrease the threshold voltage 795 with time). In yet another example, the sampled voltage increases with the decreasing threshold voltage (e.g., the voltage 591 increases with the decreasing threshold voltage 595; and/or as shown by the waveforms 908 and 910, the voltage 791 increases with the decreasing threshold voltage 795).

In yet another example, the controller is further configured to, in response to the sampled voltage and the reference voltage being equal, keep the threshold voltage constant with time (e.g., in response to the voltage 591 and the reference voltage 581 being equal, keep the threshold voltage 595 constant with time; as shown by the waveform 810, in response to the voltage 791 and the reference voltage 781 being equal, keep the threshold voltage 795 constant with time; and/or as shown by the waveforms 910, in response to the voltage 791 and the reference voltage 781 being equal, keep the threshold voltage 795 constant with time). In yet another example, the sampled voltage remains constant in response to the constant threshold voltage (e.g., the voltage 591 remains constant in response to the constant threshold voltage 595; as shown by the waveforms 808 and 810, the voltage 791 remains constant in response to the constant threshold voltage 795; and/or as shown by the waveforms 908 and 910, the voltage 791 remains constant in response to the constant threshold voltage 795).

In yet another example, the drive signal generator includes a comparator (e.g., the comparator 568 and/or the comparator 768) configured to receive the threshold voltage (e.g., the threshold voltage 595 and/or the threshold voltage 795) and the first voltage (e.g., the voltage 592 and/or the voltage 792) and generate a comparison signal based at least in part on the threshold voltage and the first voltage (e.g., generate the comparison signal 569 based at least in part on the threshold voltage 595 and the voltage 592, and/or generate the comparison signal 769 based at least in part on the threshold voltage 795 and the voltage 792), and a flip-flop (e.g., the flip-flop 572 and/or the flip-flop 772) configured to receive the comparison signal (e.g., the comparison signal 569 and/or the comparison signal 769) and generate the drive signal based at least in part on the comparison signal (e.g., generate the drive signal 594 based at least in part on the comparison signal 569, and/or generate the drive signal 794 based at least in part on the comparison signal 769).

In yet another example, the first switch (e.g., the switch 510 and/or the switch 710) is further configured to affect the first current (e.g., the current 590 and/or the current 790) flowing through the secondary winding, the second switch (e.g., the transistor 530 and/or the transistor 730) is further configured to affect the second current (e.g., the current 596 and/or the current 796) flowing through the primary winding, and the drive signal generator is further configured to receive the first voltage (e.g., the voltage 592 and/or the voltage 792), the first voltage being proportional to the first current.

In yet another example, the threshold voltage generator (e.g., the voltage-controlled voltage source 560 and/or the voltage-controlled voltage source 760) is further configured to increase the threshold voltage in response to the decreasing amplified voltage (e.g., as shown by Equation 8, and/or as shown by Equation 9), and decrease the threshold voltage in response to the increasing amplified voltage (e.g., as shown by Equation 8, and/or as shown by Equation 9).

According to yet another embodiment, a method for a power converter (e.g., the power converter 500 and/or the power converter 700) includes sampling a first voltage (e.g., the voltage 599 and/or the voltage 799) before a first switch becomes closed (e.g., before time $t_{26}$, before time $t_{46}$, and/or before time $t_{66}$). The first switch (e.g., the transistor 530 and/or the transistor 730) includes a first switch terminal (e.g., the drain terminal 1534 and/or the drain terminal 1734), a second switch terminal (e.g., the source terminal 1536 and/or the source terminal 1736), and a third switch terminal (e.g., the gate terminal 1532 and/or the gate terminal 1732). The first switch is configured to affect a first current (e.g., the current 596 and/or the current 796) associated with a primary winding (e.g., the primary winding 504 and/or the primary winding 704) of the power converter. Additionally, the method includes generating a sampled voltage (e.g., the voltage 591 and/or the voltage 791) based at least in part on the first voltage (e.g., the voltage 599 and/or the voltage 799). The first voltage is related to a voltage difference before a first switch becomes closed (e.g., before time $t_{26}$, before time $t_{46}$, and/or before time $t_{66}$). The first switch terminal (e.g., the drain terminal 1534 and/or the drain terminal 1734) corresponds to a second voltage, and the second switch terminal (e.g., the source terminal 1536 and/or the source terminal 1736) corresponds to a third voltage. The second voltage minus the third voltage is equal to the voltage difference (e.g., $V_{ds}$). Moreover, the method includes receiving the sampled voltage and a reference voltage (e.g., the reference voltage 581 and/or the reference voltage 781), and generating an amplified voltage (e.g., the compensation voltage 583 and/or the compensation voltage 783) based at least in part on the sampled voltage and the reference voltage. Also, the method includes generating a threshold voltage based on at least information associated with the amplified voltage (e.g., generating the threshold voltage 595 based on at least information associated with the compensation voltage 583, and/or generating the threshold voltage 795 based on at least information associated with the compensation voltage 783). Additionally, the method includes receiving the threshold voltage (e.g., the threshold voltage 595 and/or the threshold voltage 795) and a fourth voltage (e.g., the voltage 592 and/or the voltage 792), and generating a drive signal (e.g., the drive signal 594 and/or the drive signal 794) based at least in part on the threshold voltage and the fourth voltage. Moreover, the method includes outputting the drive signal to a second switch. The fourth voltage representing a second current. The second switch (e.g., the switch 510 and/or the switch 710) includes a fourth switch terminal, a fifth switch terminal, and a sixth switch terminal, and is configured to affect the second current (e.g., the current 590 and/or the current 790) associated with a secondary winding (e.g., the secondary winding 506 and/or the secondary winding 706) coupled to the primary winding. The generating a drive signal based at least in part on the threshold voltage and the fourth voltage includes, in response to the fourth voltage becoming larger than the threshold voltage, generating the drive signal to open the second switch (e.g., in response to the voltage 592 becoming larger than the threshold voltage 595, generating the drive signal 594 to open the switch 510; and/or in response to the voltage 792 becoming larger than the threshold voltage 795, generating the drive signal 794 to open the switch 710). The generating a threshold voltage based on at least information associated with the amplified voltage includes, in response to the sampled voltage and the reference voltage not being equal, changing the threshold voltage with time (e.g., in response to the voltage 591 and the reference voltage 581 not being equal, changing the threshold voltage 595 with time; and/or in response to the voltage 791 and the reference voltage 781 not being equal, changing the threshold voltage 795 with time). For example, the method is implemented according to at least FIG. 6, FIG. 7, FIG. 8, FIG. 9, and/or FIG. 10.

In another example, the generating a threshold voltage based on at least information associated with the amplified voltage includes, in response to the sampled voltage being larger than the reference voltage, increasing the threshold voltage with time (e.g., as shown by the waveform 610, in response to the voltage 591 being larger than the reference voltage 581, increasing the threshold voltage 595 with time; and/or as shown by the waveform 810, in response to the voltage 791 being larger than the reference voltage 781, increasing the threshold voltage 795 with time). In yet another example, the method further includes causing the sampled voltage to decrease with the increasing threshold voltage (e.g., as shown by the waveforms 608 and 610, causing the voltage 591 to decrease with the increasing threshold voltage 595; and/or as shown by the waveforms 808 and 810, causing the voltage 791 to decrease with the increasing threshold voltage 795).

In yet another example, the generating a threshold voltage based on at least information associated with the amplified voltage includes, in response to the sampled voltage being smaller than the reference voltage, decreasing the threshold voltage with time (e.g., in response to the voltage 591 being smaller than the reference voltage 581, decreasing the threshold voltage 595 with time; and/or as shown by the waveform 910, in response to the voltage 791 being smaller than the reference voltage 781, decreasing the threshold voltage 795 with time). In yet another example, the method further includes causing the sampled voltage to increase with the decreasing threshold voltage (e.g., causing the voltage 591 to increase with the decreasing threshold voltage 595; and/or as shown by the waveforms 908 and 910, causing the voltage 791 to increase with the decreasing threshold voltage 795).

In yet another example, the generating a threshold voltage based on at least information associated with the amplified voltage includes, in response to the sampled voltage and the reference voltage being equal, keeping the threshold voltage constant with time (e.g., in response to the voltage 591 and the reference voltage 581 being equal, keeping the threshold voltage 595 constant with time; as shown by the waveform 810, in response to the voltage 791 and the reference voltage 781 being equal, keeping the threshold voltage 795 constant with time; and/or as shown by the waveforms 910, in response to the voltage 791 and the reference voltage 781 being equal, keeping the threshold voltage 795 constant with time). In yet another example, the method further includes causing the sampled voltage to remain constant in response to the constant threshold voltage (e.g., causing the voltage 591 to remain constant in response to the constant threshold voltage 595; as shown by the waveforms 808 and 810, causing the voltage 791 to remain constant in response to the constant threshold voltage 795; and/or as shown by the waveforms 908 and 910, causing the voltage 791 to remain constant in response to the constant threshold voltage 795).

In yet another example, the generating a threshold voltage based on at least information associated with the amplified voltage includes receiving the threshold voltage (e.g., the threshold voltage 595 and/or the threshold voltage 795) and the fourth voltage (e.g., the voltage 592 and/or the voltage 792), generating a comparison signal based at least in part on the threshold voltage and the fourth voltage (e.g., generating the comparison signal 569 based at least in part on the threshold voltage 595 and the voltage 592, and/or generating the comparison signal 769 based at least in part on the threshold voltage 795 and the voltage 792), receiving the comparison signal (e.g., the comparison signal 569 and/or the comparison signal 769), and generating the drive signal based at least in part on the comparison signal (e.g., generating the drive signal 594 based at least in part on the comparison signal 569, and/or generating the drive signal 794 based at least in part on the comparison signal 769).

In yet another example, the first current (e.g., the current 596 and/or the current 796) flows through the primary winding, the second current (e.g., the current 590 and/or the current 790) flows through the secondary winding, and the fourth voltage (e.g., the voltage 592 and/or the voltage 792) is proportional to the second current. In yet another example, wherein the generating a threshold voltage based on at least information associated with the amplified voltage includes increasing the threshold voltage in response to the decreasing amplified voltage (e.g., as shown by Equation 8, and/or as shown by Equation 9), and decreasing the threshold voltage in response to the increasing amplified voltage (e.g., as shown by Equation 8, and/or as shown by Equation 9).

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A power converter, the power converter comprising:
   a first switch including a first switch terminal, a second switch terminal, and a third switch terminal, the first switch being configured to affect a first current associated with a primary winding, the first switch terminal corresponding to a first voltage, the second switch terminal corresponding to a second voltage, the first voltage minus the second voltage being equal to a voltage difference;
   a sampled-voltage generator configured to sample a third voltage before the first switch becomes closed and generate a sampled voltage based at least in part on the third voltage, the third voltage being related to the voltage difference before the first switch becomes closed;
   an error amplifier configured to receive the sampled voltage and a reference voltage and generate an amplified voltage based at least in part on the sampled voltage and the reference voltage;
   a threshold voltage generator configured to generate a threshold voltage based on at least information associated with the amplified voltage; and
   a drive signal generator configured to receive the threshold voltage and a fourth voltage, generate a drive signal based at least in part on the threshold voltage and the fourth voltage, and output the drive signal to a second switch, the fourth voltage representing a second current;
   wherein the power converter is configured to, in response to the sampled voltage and the reference voltage not being equal, change the threshold voltage with time.

2. The power converter of claim 1 is further configured, in response to the sampled voltage being larger than the reference voltage, increase the threshold voltage with time.

3. The power converter of claim 1 is further configured, in response to the sampled voltage being smaller than the reference voltage, decrease the threshold voltage with time.

4. The power converter of claim 1 is further configured to, in response to the sampled voltage and the reference voltage being equal, keep the threshold voltage constant with time.

5. The power converter of claim 1 wherein the drive signal generator includes:
   a comparator configured to receive the threshold voltage and the fourth voltage and generate a comparison signal based at least in part on the threshold voltage and the fourth voltage; and
   a flip-flop configured to receive the comparison signal and generate the drive signal based at least in part on the comparison signal.

6. The power converter of claim 1 wherein:
   the first switch is further configured to affect the first current flowing through the primary winding; and
   the drive signal generator is further configured to receive the fourth voltage, the fourth voltage being proportional to the second current.

7. A controller for a power converter, the controller comprising:
a sampled-voltage generator configured to sample a first voltage before a first switch becomes closed and generate a sampled voltage based at least in part on the first voltage, the first voltage being related to a voltage difference before the first switch becomes closed, the first switch including a first switch terminal, a second switch terminal, and a third switch terminal and configured to affect a first current associated with a primary winding of the power converter, the first switch terminal corresponding to a second voltage, the second switch terminal corresponding to a third voltage, the voltage difference being equal to the second voltage minus the third voltage; and
an error amplifier configured to receive the sampled voltage and a reference voltage, generate an amplified voltage based at least in part on the sampled voltage and the reference voltage, and output the amplified voltage in order for a threshold voltage generator to generate a threshold voltage;
wherein the threshold voltage generator is configured to:
generate the threshold voltage based on at least information associated with the amplified voltage; and
output the threshold voltage to a drive signal generator;
wherein the drive signal generator is configured to:
receive the threshold voltage and a fourth voltage;
generate a drive signal based at least in part on the threshold voltage and the fourth voltage, the fourth voltage representing a second current associated with a secondary winding of the power converter, the secondary winding coupled to the primary winding; and
output the drive signal to a second switch;
wherein the controller is configured to, in response to the sampled voltage and the reference voltage not being equal, generate the amplified voltage to change the threshold voltage with time.

8. The controller of claim 7 is further configured, in response to the sampled voltage being larger than the reference voltage, generate the amplified voltage to increase the threshold voltage with time.

9. The controller of claim 7 is further configured, in response to the sampled voltage being smaller than the reference voltage, generate the amplified voltage to decrease the threshold voltage with time.

10. The controller of claim 7 is further configured to, in response to the sampled voltage and the reference voltage being equal, generate the amplified voltage to keep the threshold voltage constant with time.

11. A controller for a power converter, the controller comprising:
a threshold voltage generator configured to generate a threshold voltage based on at least information associated with an amplified voltage generated by an error amplifier; and
a drive signal generator configured to receive the threshold voltage and a first voltage, generate a drive signal based at least in part on the threshold voltage and the first voltage, and output the drive signal to a first switch, the first voltage representing a first current, the first switch including a first switch terminal, a second switch terminal, and a third switch terminal and configured to affect the first current associated with a secondary winding coupled to a primary winding of the power converter;

wherein the error amplifier is configured to:
receive a sampled voltage from a sampled-voltage generator and a reference voltage; and
generate the amplified voltage based at least in part on the sampled voltage and the reference voltage;
wherein the sampled-voltage generator is configured to:
sample a second voltage before a second switch becomes closed; and
generate the sampled voltage based at least in part on the second voltage, the second voltage being related to a voltage difference before the second switch becomes closed;
wherein the threshold voltage generator is further configured to, in response to the sampled voltage and the reference voltage not being equal, change the threshold voltage with time.

12. The controller of claim 11 is further configured, in response to the sampled voltage being larger than the reference voltage, increase the threshold voltage with time.

13. The controller of claim 11 is further configured, in response to the sampled voltage being smaller than the reference voltage, decrease the threshold voltage with time.

14. The controller of claim 11 is further configured to, in response to the sampled voltage and the reference voltage being equal, keep the threshold voltage constant with time.

15. The controller of claim 11 wherein the drive signal generator includes:
a comparator configured to receive the threshold voltage and the first voltage and generate a comparison signal based at least in part on the threshold voltage and the first voltage; and
a flip-flop configured to receive the comparison signal and generate the drive signal based at least in part on the comparison signal.

16. The power converter of claim 11 wherein:
the first switch is further configured to affect the first current flowing through the secondary winding; and
the drive signal generator is further configured to receive the first voltage, the first voltage being proportional to the first current.

17. The controller of claim 11 wherein the threshold voltage generator is further configured to:
increase the threshold voltage in response to the amplified voltage decreasing; and
decrease the threshold voltage in response to the amplified voltage increasing.

18. A method for a power converter, the method comprising:
sampling a first voltage before a first switch becomes closed, the first switch including a first switch terminal, a second switch terminal, and a third switch terminal, the first switch being configured to affect a first current associated with a primary winding of the power converter;
generating a sampled voltage based at least in part on the first voltage, the first voltage being related to a voltage difference before a first switch becomes closed, the first switch terminal corresponding to a second voltage, the second switch terminal corresponding to a third voltage, the second voltage minus the third voltage being equal to the voltage difference;
receiving the sampled voltage and a reference voltage;
generating an amplified voltage based at least in part on the sampled voltage and the reference voltage;
generating a threshold voltage based on at least information associated with the amplified voltage;

receiving the threshold voltage and a fourth voltage;
generating a drive signal based at least in part on the threshold voltage and the fourth voltage; and
outputting the drive signal to a second switch, the fourth voltage representing a second current;
wherein the generating the threshold voltage based on at least information associated with the amplified voltage includes, in response to the sampled voltage and the reference voltage not being equal, changing the threshold voltage with time.

19. The method of claim 18 wherein the generating the threshold voltage based on at least information associated with the amplified voltage includes, in response to the sampled voltage being larger than the reference voltage, increasing the threshold voltage with time.

20. The method of claim 18, and further comprising causing the sampled voltage to decrease with the threshold voltage increasing.

21. The method of claim 18 wherein the generating the threshold voltage based on at least information associated with the amplified voltage includes, in response to the sampled voltage being smaller than the reference voltage, decreasing the threshold voltage with time.

22. The method of claim 18, and further comprising causing the sampled voltage to increase with the decreasing threshold voltage.

23. The method of claim 18 wherein the generating the threshold voltage based on at least information associated with the amplified voltage includes, in response to the sampled voltage and the reference voltage being equal, keeping the threshold voltage constant with time.

24. The method of claim 18 wherein the generating the threshold voltage based on at least information associated with the amplified voltage includes:
   receiving the threshold voltage;
   generating a comparison signal based at least in part on the threshold voltage and the fourth voltage;
   receiving the comparison signal; and
   generating the drive signal based at least in part on the comparison signal.

25. The method of claim 18 wherein:
   the first current flows through the primary winding;
   the second current flows through a secondary winding; and
   the fourth voltage is proportional to the second current.

26. The method of claim 18 wherein the generating the threshold voltage based on at least information associated with the amplified voltage includes:
   increasing the threshold voltage in response to the amplified voltage decreasing; and
   decreasing the threshold voltage in response to the amplified voltage increasing.

* * * * *